United States Patent
Arndt et al.

[11] Patent Number: 5,924,634
[45] Date of Patent: Jul. 20, 1999

[54] ORIFICE PLATE, IN PARTICULAR FOR INJECTION VALVES, AND METHOD FOR MANUFACTURING AN ORIFICE PLATE

[75] Inventors: Stefan Arndt, Stuttgart; Dietmar Hahn, Gerlingen; Heinz Fuchs, Stuttgart; Gottfried Flik, Leonberg; Guenter Dantes, Eberdingen; Gilbert Moersch; Detlef Nowak, both of Stuttgart; Joerg Heyse, Markgröningen; Beate Ader, Stuttgart; Frank Schatz, Kornwestheim, all of Germany

[73] Assignee: Robert Bosch GmbH, Stuttgart, Germany

[21] Appl. No.: 08/737,758

[22] PCT Filed: Mar. 23, 1996

[86] PCT No.: PCT/DE96/00511

§ 371 Date: Nov. 22, 1996

§ 102(e) Date: Nov. 22, 1996

[87] PCT Pub. No.: WO96/30644

PCT Pub. Date: Oct. 3, 1996

[30] Foreign Application Priority Data

Mar. 29, 1995 [DE] Germany .................. P1 95 11 540
Feb. 27, 1996 [DE] Germany .................. P1 96 07 266

[51] Int. Cl.⁶ .................. F02M 61/18; F02M 61/16; F02M 51/06; B05B 1/34
[52] U.S. Cl. .................. 239/553; 239/533.12; 239/585.1; 239/590; 239/596; 239/900
[58] Field of Search .................. 239/533.3, 533.12, 239/585.1–585.5, 596, 601, DIG. 17, 900, 553, 590; 205/75

[56] References Cited

U.S. PATENT DOCUMENTS

| 4,528,070 | 7/1985 | Gamblin .................. 204/11 |
| 4,907,748 | 3/1990 | Gardner et al. .................. 239/584 |
| 5,207,865 | 5/1993 | Satoh . |
| 5,383,597 | 1/1995 | Sooriakumar et al. .................. 239/596 X |
| 5,449,114 | 9/1995 | Wells et al. .................. 239/596 X |
| 5,484,108 | 1/1996 | Nally .................. 239/585.4 |
| 5,570,841 | 11/1996 | Pace et al. .................. 239/585.1 |
| 5,685,491 | 11/1997 | Marks et al. .................. 239/596 X |

FOREIGN PATENT DOCUMENTS

| 0 314 285 | 5/1989 | European Pat. Off. . |
| 354660 | 2/1990 | European Pat. Off. . |
| 611886 | 8/1994 | European Pat. Off. . |
| 4331851 | 3/1995 | Germany . |
| 56-005979 | 1/1981 | Japan . |

*Primary Examiner*—Lesley D. Morris
*Attorney, Agent, or Firm*—Kenyon & Kenyon

[57] ABSTRACT

An orifice plate includes a complete axial through passage for a fluid, in particular for a fuel, including inlet openings, outlet openings, and at least one conduit located between them. The inlet and outlet openings are arranged in the orifice plate so that they do not overlap at any point when projected into one plane. This offset of the outlet openings with respect to the inlet openings results in an S-shaped flow profile for the medium, onto which an atomization-promoting turbulence is thus imposed. The orifice plate is particularly suitable for use on injection valves in fuel injection systems, in paint nozzles, or for freeze-drying processes.

27 Claims, 17 Drawing Sheets

ORIFICE PLATE, IN PARTICULAR FOR INJECTION VALVES, AND METHOD FOR MANUFACTURING AN ORIFICE PLATE

FIELD OF THE INVENTION

The present invention relates to an orifice plate, in particular for injection valves, and to a method for manufacturing an orifice plate.

BACKGROUND OF THE INVENTION

It is shown in European Patent Application No. 0 354 660 to manufacture nozzles, in the form of orifice plates, which represent "S-type" plates. Therefore, the inlet and outlet openings in the orifice plate are configured at an offset to one another, thus necessarily creating an "S-bend" in the flow of a fluid flowing through the orifice plate. The proposed orifice plates are constituted by two flat platelets made of silicon and assembled together by bonding. Regions of reduced thickness are shaped out of the silicon platelets so that shear gaps are formed parallel to the end surfaces of the platelets between the openings of the first platelet and the one opening of the second platelet. The inlet and outlet openings are manufactured with the known mask method by etching onto silicon wafers that possess a plurality of orifice plate structures. The troncoconical contours for the openings in the orifice plate result logically from the anisotropic etching technique.

A valve arrangement consisting of an elastic silicon valve platelet and a nozzle platelet, also made of silicon, is shown in European Patent Application No. 0 314 285. The two silicon platelets are joined to one another and can be deflected relative to one another. Inlet openings that are arranged at an offset from outlet openings in the nozzle platelet are provided in the silicon valve platelet. With the valve arrangement in the closed state, plateau surfaces of the silicon valve platelet seal off the outlet openings in the nozzle platelet, while when the nozzle platelet is bent by means of an actuation member, an S-shaped passage for a fluid is created and the valve arrangement is open.

A fuel injection valve that has at its downstream end a nozzle consisting of two silicon platelets is already known from U.S. Pat. No. 4,907,748. Similarly to the orifice plates described above, the inlet and outlet openings in the two silicon platelets have offsets to one another, resulting in an "S-bend" in the flow of a fluid, in this case fuel, as it flows through.

All the aforementioned orifice plates made of silicon have the disadvantage of possibly insufficient fracture resistance, resulting from the brittleness of silicon. There is a risk, specifically under continuous loads, for example on an injection valve (engine vibrations), that the silicon platelets will break. Mounting the silicon platelets to metallic components, for example to injection valves, is difficult, since special stress-free clamping solutions must be found and sealing on the valve is problematic. It is impossible, for example, to weld the silicon orifice plates to the injection valve. Moreover there is the disadvantage of edge wear on the openings of the silicon plates as a fluid repeatedly flows through them.

Also already known, from German Patent No. 483 615, is a nozzle for fuel-injected internal combustion engines that is also constituted by two nozzle platelets, the nozzle platelets having inlet and outlet openings, arranged at an offset to one another, in order to promote disaggregation of the fuel flowing through. With this nozzle, however, it is in no way possible to shape the injected fuel in accordance with a desired geometry.

SUMMARY OF THE INVENTION

An orifice plate according to the present invention has the advantage that homogeneous ultrafine atomization of a fluid is achieved without additional energy, i.e. only by means of the available medium pressure, a particularly high atomization quality and a stream shaping adapted to the particular requirements being achieved. Among the consequences of using such an orifice plate on an injection valve of an internal combustion engine are reduced exhaust emission by the internal combustion engine, as well as a decrease in fuel consumption.

For example, exotic, bizarre stream shapes can be generated with the orifice plates according to the invention in the form of S-type plates. For single-, double-, and multiple-stream sprays, these orifice plates allow stream cross sections in innumerable variants, for example rectangles, triangles, crosses, or ellipses. These unusual stream shapes allow precise, optimum adaptation to existing geometries, e.g. to different intake manifold cross sections of internal combustion engines. Resulting therefrom are the advantages of geometrically adapted utilization of the available cross section for homogeneously distributed, emissions-reducing mixture introduction, and elimination of emissions-promoting surface film deposits on the intake manifold walls.

It is only advantageous to provide the conduits, configured as flow connections of the inlet and outlet openings, with conduit cavities in which flow eddies are driven by the fluid flowing past. The interaction between the eddy and the driving flow leads to temporal instabilities in the interaction area. The flow is forced to oscillate, so that on the one hand unique stream patterns can be generated, but on the other hand the resulting turbulence also leads to a reduction in the average droplet diameter in the spray.

A further advantage results from the use of an interrupter in the orifice plate. An eddy train with strong transverse pulses is created downstream from an interrupter of this kind. The turbulence in the eddy train helps ensure that a homogeneous spray with very fine droplets is discharged. The consequence of the advantageous reduction in the average droplet diameter in the spray is a homogeneous spray distribution, caused by the lower droplet distribution density resulting from the homogeneous spray. The result of this is a reduced probability of droplet coagulation.

The method according to the present invention for manufacturing an orifice plate is advantageous since the orifice plates can be manufactured reproducibly, extremely accurately and cost-effectively, simultaneously in very large unit volumes, and that their metallic configuration are fracture-resistant and can be mounted simply and cost-effectively, for example by welding, to metal components, for example injection valves. The process steps according to the present invention allow an extremely wide freedom of configuration, since the contours of the openings in the orifice plate can be selected as desired. Advantageously, methods such as UV three-dimensional lithography, dry etching, or ablation are combined with micro-electroplating in order to deposit metal layers, with new structures in each case, onto one another. This process is suitable for building up two, three, or more layers for an orifice plate.

It is further advantageous to build up at least one layer of the orifice plate, comprising two planes or functional planes, in one electroplating step, "lateral overgrowth" of the electroplating being utilized. Growth of the metal is thus deliberately continued over the photoresist structure of the previous plane, without additional application of an electroplating initiator layer and a new layer of photoresist. Considerable savings in cost and time are achieved by means of "lateral overgrowth."

DETAILED DESCRIPTION OF THE INVENTION

Figure 1:
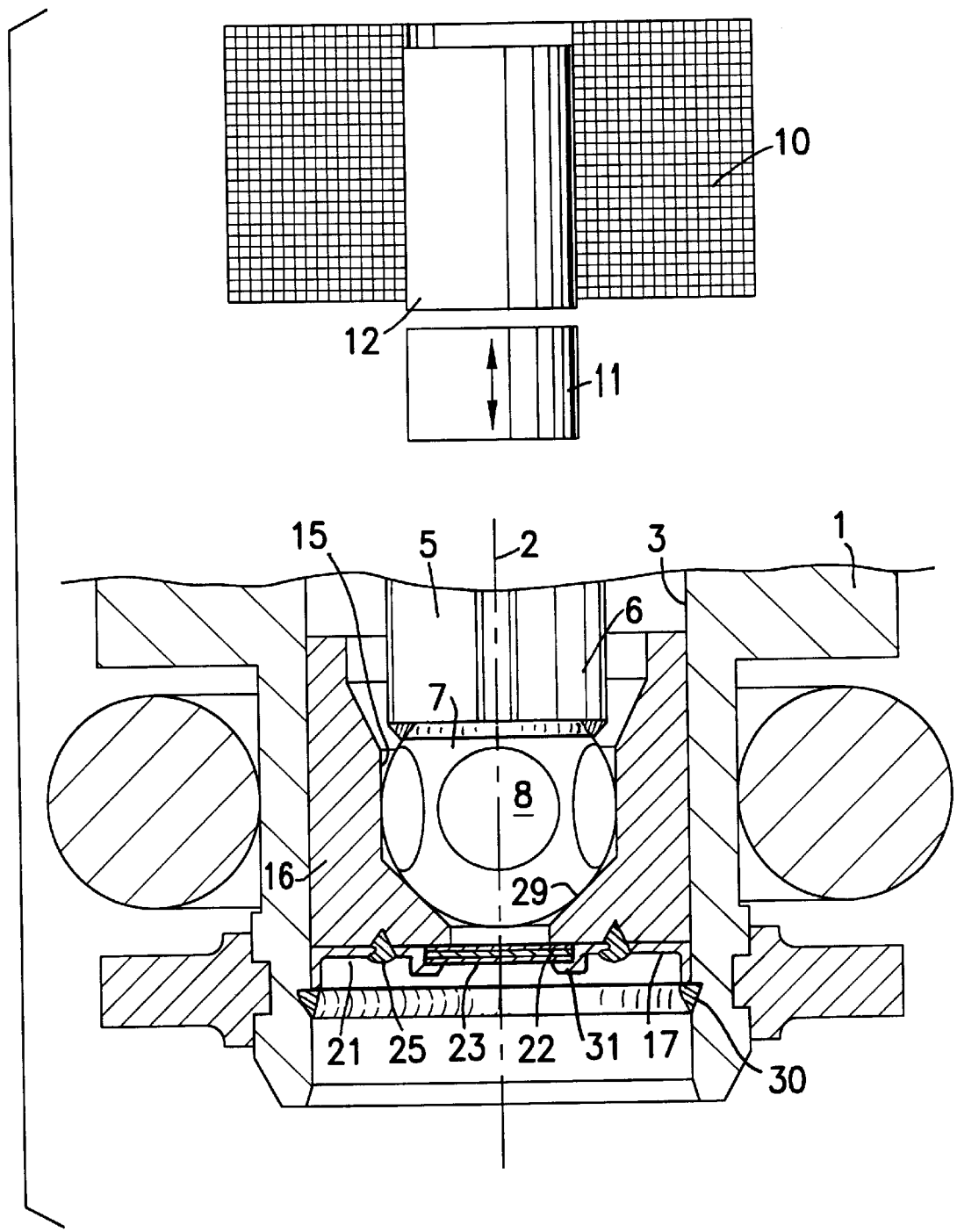
FIG. 1 shows a partially depicted injection valve with an orifice plate according to the present invention.

FIG. 1 partially depicts, an embodiment of, a valve according to the present invention in the form of an injection valve for fuel injection systems of mixture-compressing, internal combustion engines with externally supplied ignition. The injection valve has a tubular valve seat support 1, in which a longitudinal opening 3 is configured concentrically with a longitudinal valve axis 2. Arranged in longitudinal opening 3 is a, for example, tubular valve needle 5, which is joined at its downstream end 6 to a, for example, spherical valve closure element 7, on whose circumference for example five flattened areas 8 are provided.

The injection valve is actuated in a known manner, for example electromagnetically. An indicated electromagnetic circuit with a magnet coil 10, an armature 11, and a core 12, serves to move valve needle 5 axially and thus open the injection valve against the spring force of a return spring (not shown), or close it. Armature 11 is joined to the end of valve needle 5 facing away from valve closure element 7, for example by a weld bead by means of a laser, and aligned with core 12.

A guide opening 15 of a valve seat element 16 serves to guide valve closure element 7 during the axial movement. Cylindrical valve seat element 16 is sealedly mounted by welding, in longitudinal opening 3 extending concentrically with longitudinal axis 2, into the downstream end of valve seat support 1 facing away from core 12. At its lower end surface 17 facing away from valve closure element 7, valve seat element 16 is concentrically and permanently joined to a, for example, cup-shaped support plate 21, which is therefore in direct contact against valve seat element 16. The shape of support disk 21 is similar to that in previously known cup-shaped spray-orifice plates, a central region of support plate 21 being equipped with a stepped opening 22 so that an orifice plate 23 according to the invention can be received in it.

Valve seat element 16 and support plate 21 are joined, for example, by a circumferential and impermeable first weld bead 25 configured by means of a laser. This type of installation eliminates the danger of undesired deformation of support plate 21 in its central region, with opening 22 and orifice plate 23 installed therein. Support plate 21 is furthermore joined to the wall of longitudinal opening 3 in valve seat support 1, for example by means of a circumferential and impermeable second weld bead 30.

The insertion depth of the valve seat part, consisting of valve seat element 16 and cup-shaped support plate 21, into longitudinal opening 3 determines the magnitude of the stroke of valve needle 5, since the one end position of valve needle 5, when magnet coil 10 is not energized, is defined by contact of valve closure element 7 against one valve seat surface 29 of valve seat element 16. The other end position of valve needle 5 is defined, when magnet coil 10 is energized, for example by the contact of armature 11 against core 12. The travel between these two end positions of valve needle 5 thus represents the stroke.

The spherical valve closure element 7 interacts with valve seat surface 29, which tapers in troncoconical form in the flow direction, of valve seat element 16, which is configured in the axial direction between guide opening 15 and the lower end surface 17 of valve seat element 16.

Orifice plate 23, arranged in opening 22 of support plate 21 and retained by support plate 21 directly against end surface 17 of valve seat element 16, is depicted in FIG. 1 only in simplified and exemplified fashion, and will be described in more detail below. Inserting orifice plate 23 into a support plate 21 and gripping it 31 for fastening, is one possible variant for mounting orifice plate 23 downstream from valve seat surface 29. Clamping of this kind, for indirect fastening of orifice plate 23 onto valve seat element 16, has the advantage that temperature-related deformations which might occur with methods such as welding or soldering are avoided. Support plate 21 does not, however, by any means constitute an exclusive condition for fastening orifice plate 23. Since the fastening possibilities are not essential to the present invention, reference will be made here only to commonly known joining methods, such as welding, soldering, or adhesive bonding.

Figure 2:
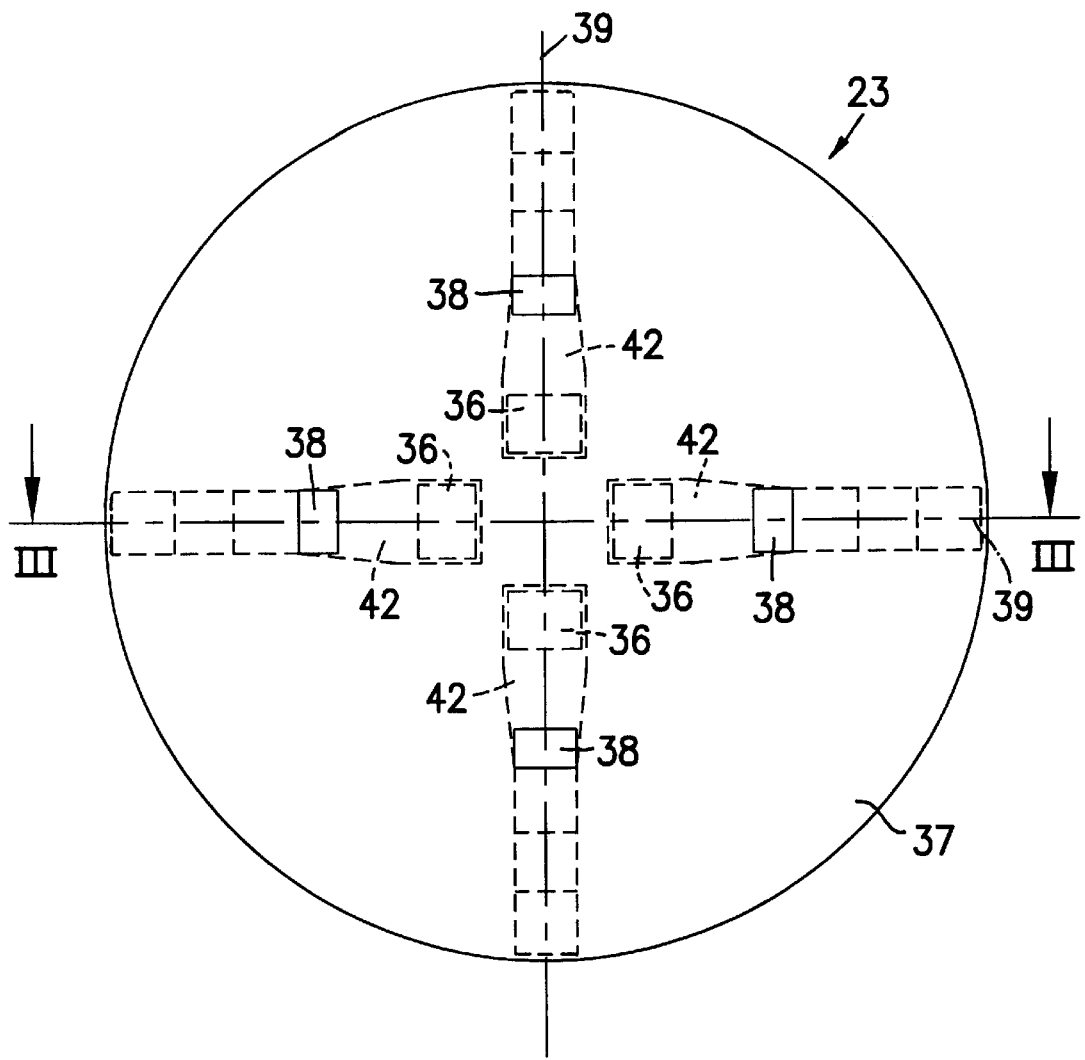
FIG. 2 shows a bottom view of an orifice plate according to the present invention.

FIG. 2 shows orifice plate 23 in a view from below. Orifice plate 23 is configured as a smooth, flat, circular, multilayer plate, so that it can, for example, also be referred to as a multilayer spray-orifice plate. Orifice plate 23 is present, for example, centeredly in support plate 21. The method according to the invention for manufacturing orifice plate 23 results in a structure that is composed of multiple courses. This multilayer nature of orifice plate 23 is clear in FIG. 3, which depicts a view corresponding to a section along line III—III in FIG. 2. Certain essential features regarding the method as well as other aspects will first be cited briefly here, while the method according to the invention will be discussed in detail later.

Figure 3:
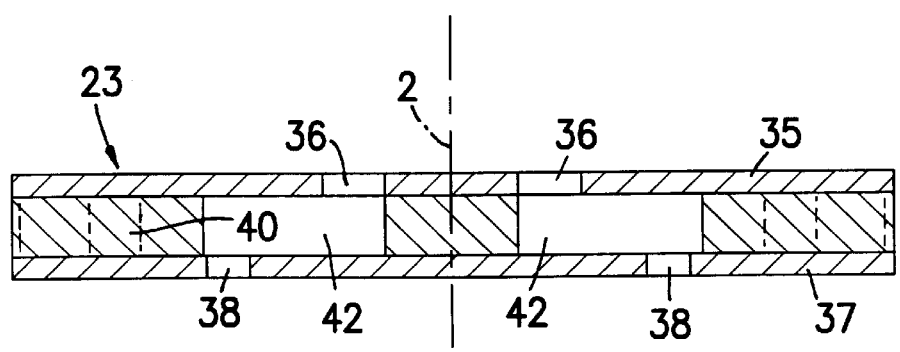
FIG. 3 shows an orifice plate in section along line III—III as illustrated in FIG. 2.

Orifice plate 23 depicted in FIGS. 2 and 3 is built up in three metallic layers by electroplating deposition. Manufacture by means of electroplating three-dimensional lithography yields the following particular features in terms of contouring:

Layers with a constant thickness that does not vary over the plate surface;

Structuring by means of three-dimensional lithography results in largely vertical incisions into the layers, which form the respective chambers through which flow occurs;

Any desired undercuts and overlaps in the incisions can be formed by multilayer buildup of individually structured metal layers;

Incisions can be made with any cross-sectional form having axially parallel walls, for example rectangle, polygon, rounded rectangle, rounded polygon, ellipse, circle, etc.

The individual layers are deposited in succession by electroplating, so that the subsequent layer joins immovably to the layer below due to electroplating adhesion.

Thus in the first embodiment according to the present invention three circular layers, for example with the same outside diameter, constitute orifice plate 23. A top layer 35 has for example four rectangular inlet openings 36, each configured at the same distance from the longitudinal valve axis 2 or the center axis of orifice plate 23, and offset 90° from one another. Inlet openings 36 are arranged very close to longitudinal valve axis 2 as compared to the diameter of orifice plate 23. Four rectangular outlet openings 38 are also provided in a bottom layer 37, at a substantially greater distance from longitudinal valve axis 2 and thus at a radial offset from inlet openings 36. Outlet openings 38 have, for example, a slighter smaller opening width than inlet openings 36. Two axes 39 of orifice plate 23 extending perpendicular to one another, intersecting at longitudinal valve axis 2, divide inlet openings 36 and outlet openings 38 at the center in each case, so that the two axes 39 represent symmetry axes of the symmetrically constructed orifice plate 23. Also extending along axes 39, in a middle layer 40 lying between the top and bottom layers 35 and 37, are radial conduits 42 which constitute a direct connection between inlet openings 36 and outlet openings 38. The slightly trapezoidal conduits 42 have, for example, a magnitude such that in projection, they just overlap inlet openings 36 and outlet openings 38. In this embodiment, according to the present invention all four conduits 42 are present separately from one another. Indicated by dashed lines in FIGS. 2 and 3 are further possible variants in which conduits 42 have different, much larger radial dimensions, so that conduits 42 then extend considerably radially outward beyond outlet openings 38 in bottom layer 37 (see FIGS. 5 and 6).

With a diameter of approximately 4 to 5 mm, orifice plate 23 has, for example, a thickness of approximately 0.5 mm, top and bottom layers 35 and 37 being, for example, each approximately 0.1 mm thick and middle layer 40 being 0.3 mm thick. These size indications regarding the dimensions of orifice plate 23, and all other dimensions indicated in the description, serve only for better comprehension, and do not in any way limit the present invention. The relative dimensions of the individual structures of orifice plate 23 in all the Figures are also not necessarily to scale.

Figure 4:
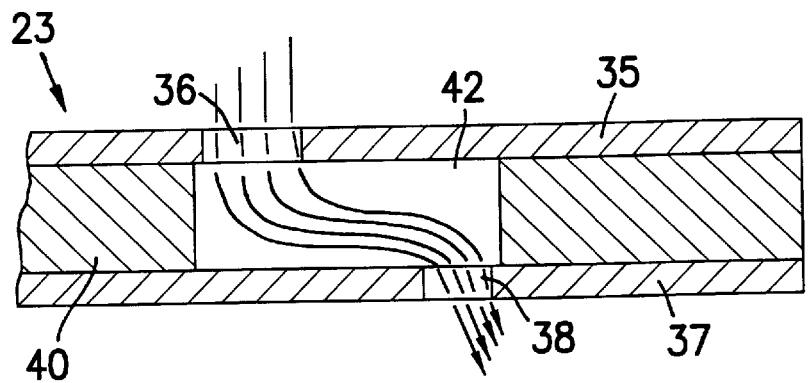
FIG. 4 shows a flow-through region of a three-layer orifice plate.

The aforementioned radial offset of outlet openings 38 with respect to inlet openings 36 results in an S-shaped flow profile for the medium, for example the fuel. The general flow conditions will be explained with reference to FIG. 4, which once again emphasizes a flow-through region of orifice plate 23 in axial section, with inlet opening 36, conduit 42, and outlet opening 38. The arrows characterizing the flow profile clearly show the S-shape, which is why the orifice plates 23 according to the invention are also referred to as "S-type" plates. Flow thus passes through orifice plate 23 from inlet opening 36 to the respective associated outlet opening 38. Proceeding from inlet opening 36, the flow for each inlet opening 36 is guided radially outward through the respective horizontally extending conduit 42. Outlet opening 38 is then located, in the example according to FIG. 4, at the end of the conduit.

The medium receives a radial velocity component due to the radially extending conduit 42. The flow does not completely lose its radial velocity component in the short axial outlet passage. Rather it emerges, detached at one side, from orifice plate 23 at the wall of outlet opening 38 facing inlet opening 36, at an angle to longitudinal valve axis or center axis 2. The combination of a plurality of individual streams, for example alignable asymmetrically with respect to one another, which can be achieved by a suitable arrangement and alignment of a plurality of units consisting of inlet and outlet openings 36 and 38 and conduits 42, makes possible entirely novel, distinctive, and complex overall stream shapes with different volume distributions.

The "S-bend" inside orifice plate 23, with a plurality of strong flow deflections, imposes a strong, atomization-promoting turbulence on the flow. The velocity gradient transverse to the flow is particularly strongly affected by this. It expresses the change in velocity transverse to the flow, the velocity in the center of the flow being much greater than in the vicinity of the walls. The increased shear stresses in the fluid resulting from the velocity differences promote disaggregation into fine droplets close to outlet openings 38. Since the flow in the outlet has detached at one side, it experiences no flow stabilization since there is no contour guidance. The fluid has a particularly high velocity on the detached side, while the velocity of the fluid decreases toward the side of outlet opening 38 with attached flow. The atomization-promoting turbulences and shear stresses are thus not annihilated upon emergence.

Figure 5:
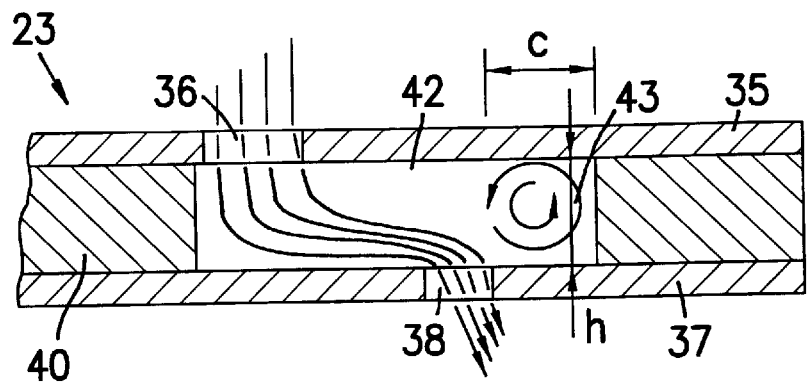
FIG. 5 shows a flow-through region of a three-layer orifice plate with a first conduit cavity.
Figure 6:
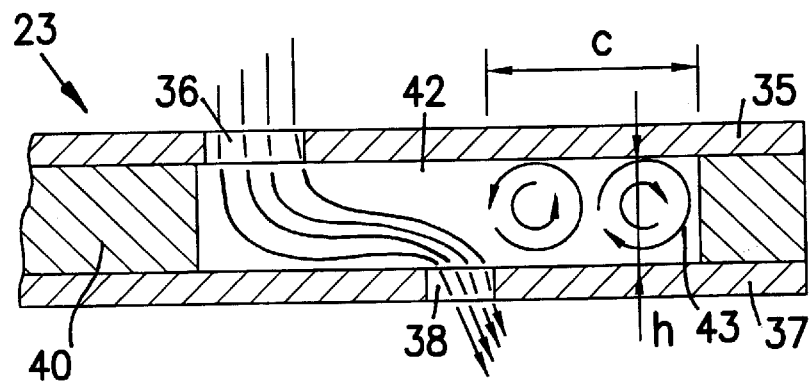
FIG. 6 shows a flow-through region of a three-layer orifice plate with a second conduit cavity.

FIGS. 5 and 6 depict exemplified embodiments of orifice plates 23 in which conduits 42 in middle layer 40 extend not only from inlet openings 36 to outlet openings 38, but beyond outlet openings 38 toward the outer boundary of orifice plates 23. These extensions of conduits 42 will be referred to hereinafter as conduit cavities 43. The statements already made are generally applicable with regard to the principle of flow guidance and the effect of stream forming and atomization. The liquid flowing in outlet opening 38 largely passes by conduit cavity 43, and drives a flow eddy in conduit cavity 43. The interaction between the eddy and the driving flow leads to temporal instabilities in the interaction area. The eddy periodically changes its size, and as it grows it pushes the passing flow away (and correspondingly vice versa when the eddy becomes smaller). The emerging flow is thus periodically deflected in terms of its direction, and thus caused to oscillate. The frequency and amplitude of the oscillations in the emerging flow depend on the shape of conduit cavity 43, specifically on the radial depth c and height h, which result from the thickness of middle layer 40. In another embodiment shown in FIG. 5, for example, c=h, while in the example in FIG. 6, c=2×h for the size of conduit cavity 43. The geometry of conduit cavity 43 shown in FIG. 6 causes a double eddy to form, the two eddies being driven by momentum exchange and having opposite eddy directions.

The oscillations in the individual emerging streams result in oscillation patterns both in the individual streams and in the overall spray. By means of these oscillation patterns, a wide variety of bizarre stream cross sections (e.g. rectangle, triangle, cross, circle) can be obtained. Without these stream oscillations these cross-sectional shapes would not be achievable; the tendency is otherwise for the individual streams to have circular cross sections. The selectable patterns or cross sections of the individual streams, or of the overall spray as the sum of all the individual streams which are in continuous interaction with one another due to momentum exchange, can thus be achieved in particular if the oscillations in the fluid are high-frequency. In addition, the spray is distributed more uniformly over the stream cross section by means of the changes in direction. The spray thus becomes more homogeneous and thus mixes better with the airflow in the intake manifold to form an emissions-reducing mixture.

The transverse pulses present transverse to the flow as a result of the turbulence cause, among other effects, a droplet distribution density in the discharged spray that is highly uniform. The result of this is a reduced probability of droplet coagulations, i.e. aggregations of small droplets into larger droplets. The consequence of the advantageous reduction in the average droplet diameter in the spray is a relatively homogeneous spray distribution. The S-bend generates in the fluid a fine-scale (high-frequency) turbulence which causes the stream to disaggregate, immediately after emerging from orifice plate 23, into correspondingly fine droplets. The greater the shear stresses resulting from the turbulence, the greater also the variation in the flow vectors. The shear stresses ensure that a "chaotic" state is present at all levels of the fluid, so that a desirable spreading of the streams or the spray occurs, capable of leading to the aforementioned different cross sections or patterns.

Figure 7:
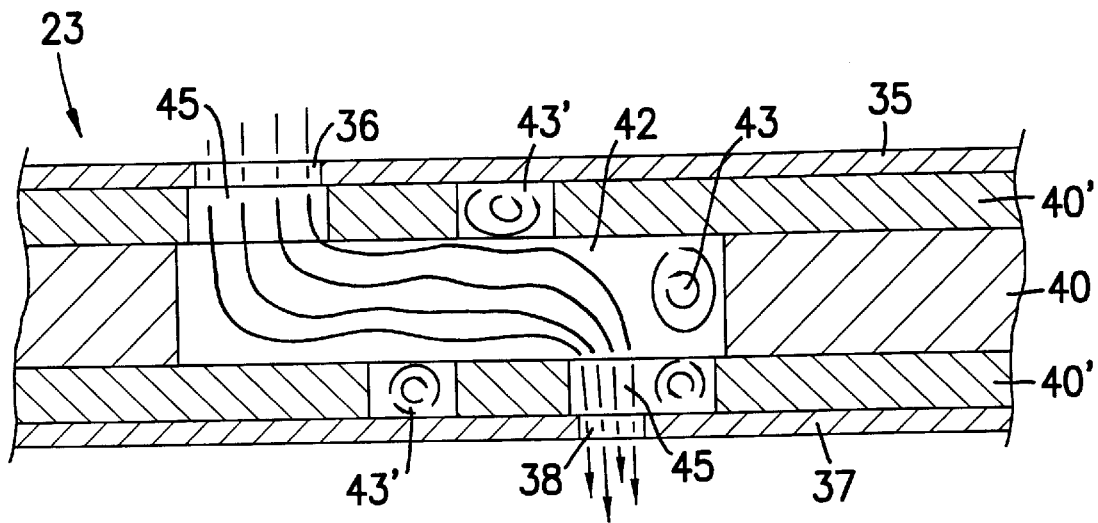
FIG. 7 shows a flow-through region of a five-layer orifice plate with conduit cavities.
Figure 8:
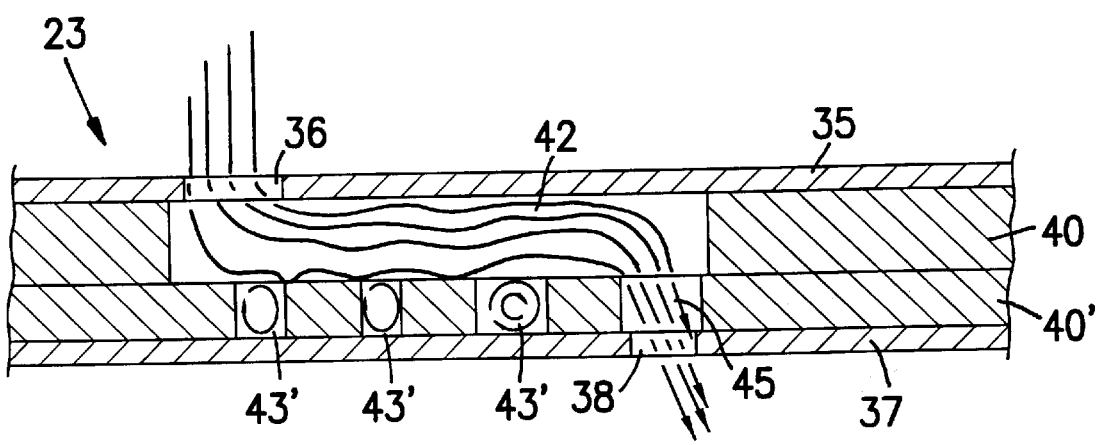
FIG. 8 shows a flow-through region of a four-layer orifice plate with conduit cavities.
Figure 9:
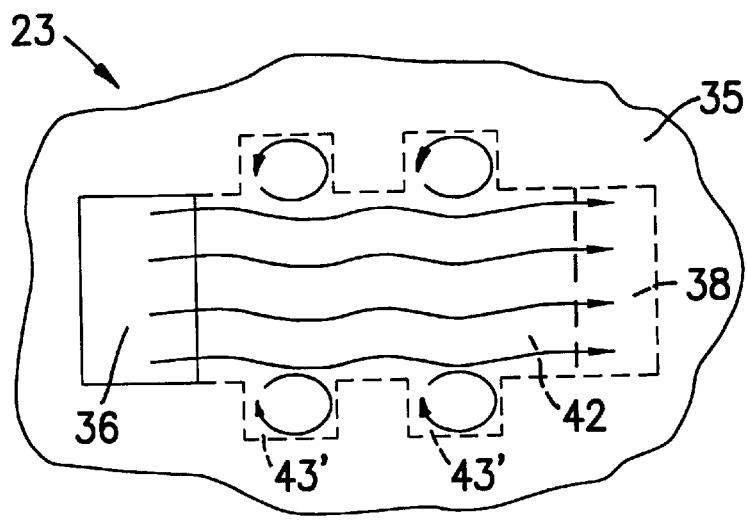
FIG. 9 shows a schematic plan view of the orifice plate with lateral conduit cavities.

FIGS. 7, 8, and 9 depict several slightly modified embodiment according to the present invention, differing from the embodiments described above by the fact that they have more than three layers, and possess conduit cavities 43 not only in the radial direction as extensions of conduit 42. FIG. 7 shows a five-layer orifice plate 23 in which, in addition to the known three layers 35, 37, and 40, two further middle layers 40' are also configured. These two additional layers 40' are each located between middle layer 40 and top or bottom layer 35 or 37. In order to ensure that the fluid flows through orifice plate 23 from inlet opening 36 to outlet opening 38, the two layers 40' also possess corresponding opening regions 45 which create the connection to conduit 42 provided in layer 40. In addition to these opening regions 45, there is also present in each of layers 40' at least one conduit cavity 43', which for example has the axial height of layer 40'. Viewed in the radial direction, conduit cavities 43' are located, for example, between inlet opening 36 and outlet opening 38. The flow of fluid thus once again drives flow eddies in conduit cavities 43'. In addition to conduit cavities 43' located at an axial offset to conduit 42, conduit cavities 43 can also be provided radially adjacent to conduit 42.

FIG. 8 shows another embodiment of an orifice plate 23 with four layers, i.e. with only one additional middle layer 40'. Depending on the arrangement of layer 40' above or below layer 40, layer 40' must in turn have an opening region 45, in this case in FIG. 8 an opening region 45 present directly at outlet opening 38. Additionally located in layer 40' are conduit cavities 43' which represent chambers, offset axially from conduit 42, in which flow eddies are created. The, for example, three conduit cavities 43' in layer 40' can be distributed at equal spacings from one another, or randomly. A schematic plan view of a portion of an orifice plate 23 is shown in FIG. 9. This shows clearly that conduit cavities 43' can not only be present in the axial direction of orifice plate 23, i.e. into its depth, but can all be configured to project beyond the width of conduit 42. Conduit cavities 43, 43' can thus be shaped onto conduit 42 in all three directions, i.e. length, width, and depth.

Figure 10:
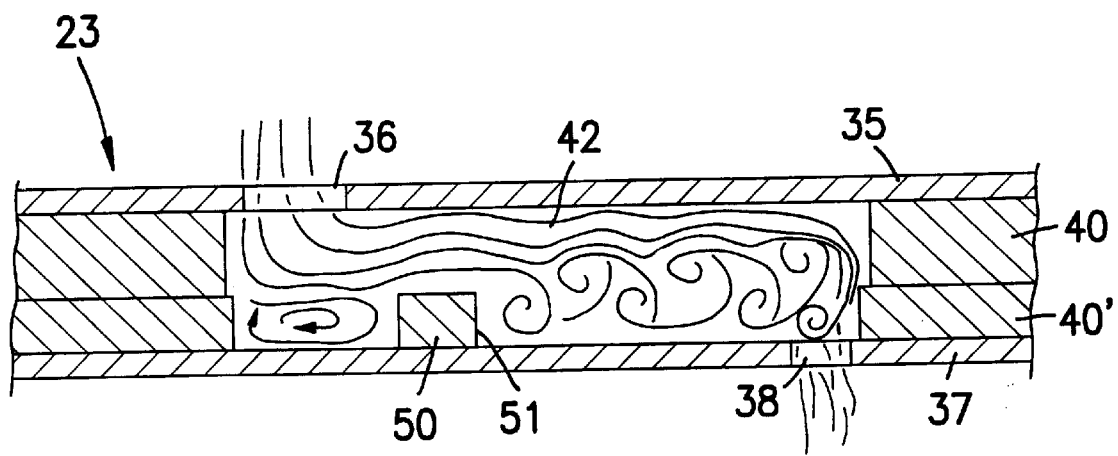
FIG. 10 shows a flow-through region of the orifice plate with an interrupter.

All the foregoing examples can be equipped with the feature of a boundary layer interrupter 50, as shown in FIG. 10. In this specific case, orifice plate 23 is configured in four layers. Thus for example two middle layers 40 and 40' are present between the two top and bottom layers 35 and 37. The additional middle layer 40', which immediately follows bottom layer 37, is configured in such a way that a sharp-edged, for example parallelepipedal elevation, i.e. an interrupter 50, extends transverse to the flow direction in the region of conduit 42. Of course it is also possible to arrange an interrupter 50 in middle layer 40, so that interrupter 50 would then project from above into conduit 42. In terms of geometry, interrupter 50 should be shaped with a radial offset from inlet opening 36. Conduit 42 extends between layers 35 and 37 in both layer 40 and layer 40'.

The main flow of the fluid passes over boundary layer interrupter 50. The flow detaches from interrupter 50 at a rear, downstream interrupter edge 51, and because of the sudden expansion in cross section downstream from interrupter 50 experiences an increase in pressure (conversion of kinetic energy into pressure energy-diffuser effect). This increase in pressure leads to intense boundary layer eddies downstream from interrupter.

This results, downstream from interrupter 50, in a continuously expanding eddy train with strong transverse pulses, which extends to outlet opening 38. The eddy train extends through the main flow as a "turbulence line." The turbulence in the eddy train can be very fine-scale (high-frequency), and can have a large amplitude. Frequency and amplitude are adjusted by way of the height of interrupter 50 and the velocity of the main flow passing by, i.e. by way of the conduit cross-sectional area above interrupter 50.

The eddy train can reduce flow-through losses, since a highly turbulent momentum exchange takes place in it in the direction of the walls, transverse to the main flow. The result is that downstream from interrupter 50, the main flow has less of a tendency to detach from the walls of conduit 42, and thus better utilizes the available flow cross sections. Detachment of the flow from the wall would lead to a pressure drop. Interrupter 50 again serves to deliver a homogeneous spray that disaggregates into very fine droplets, so that in turn a wide variety of spray patterns can be achieved.

Figure 11:
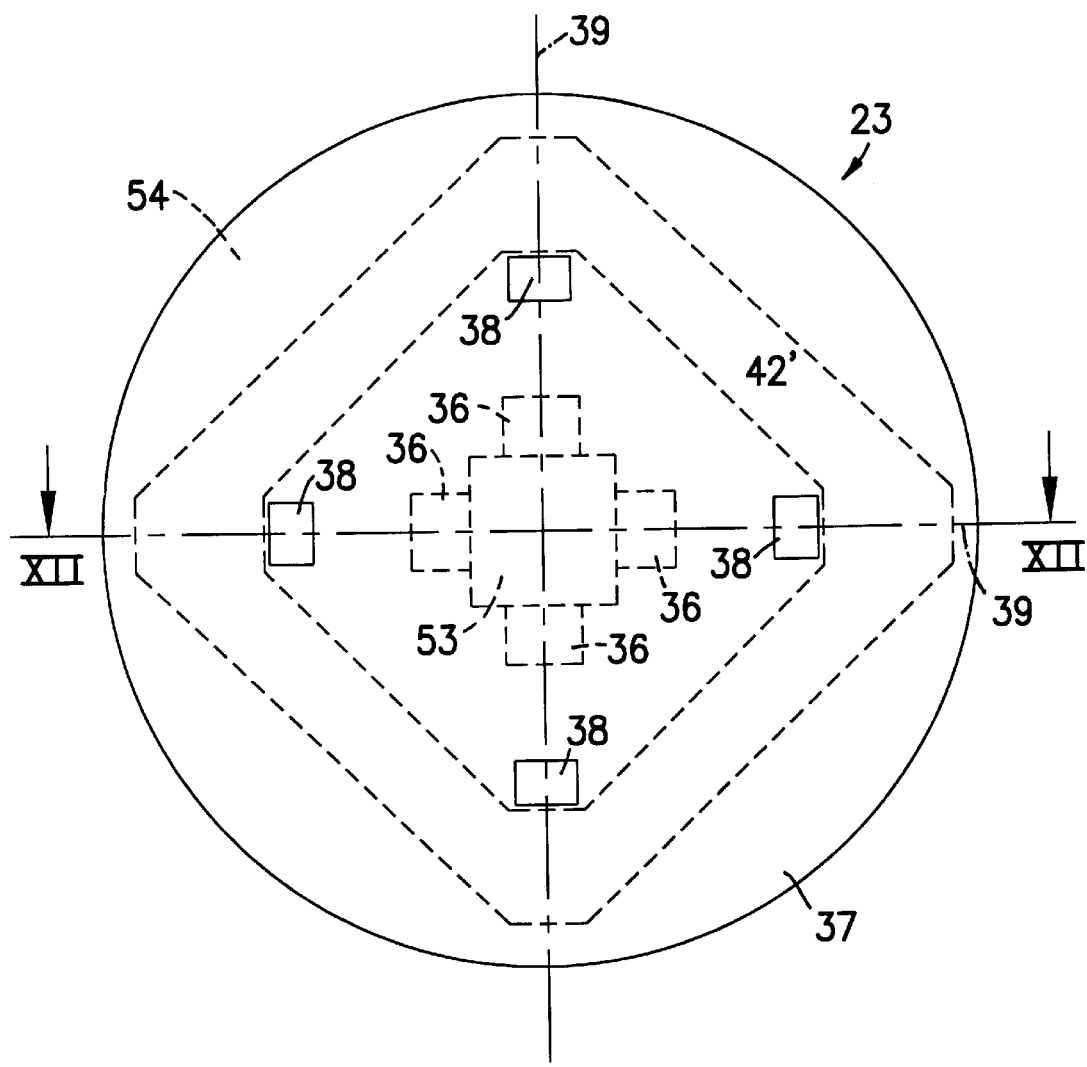
FIG. 11 shows a bottom view of the orifice plate according to another embodiment of the present invention.
Figure 12:
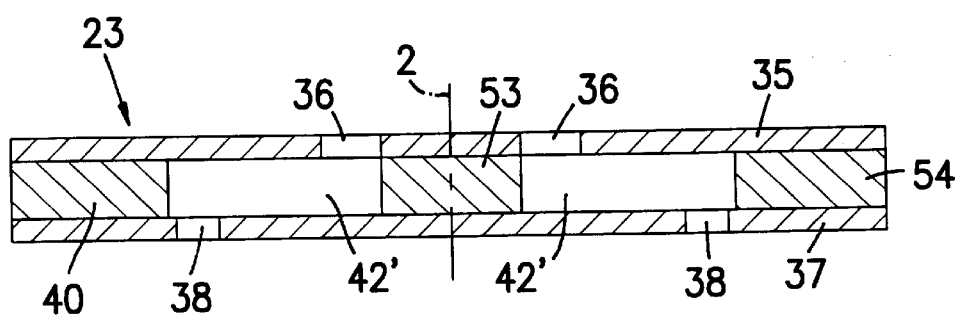
FIG. 12 shows an orifice plate in section along line XII—XII as illustrated in FIG. 11.
Figure 13:
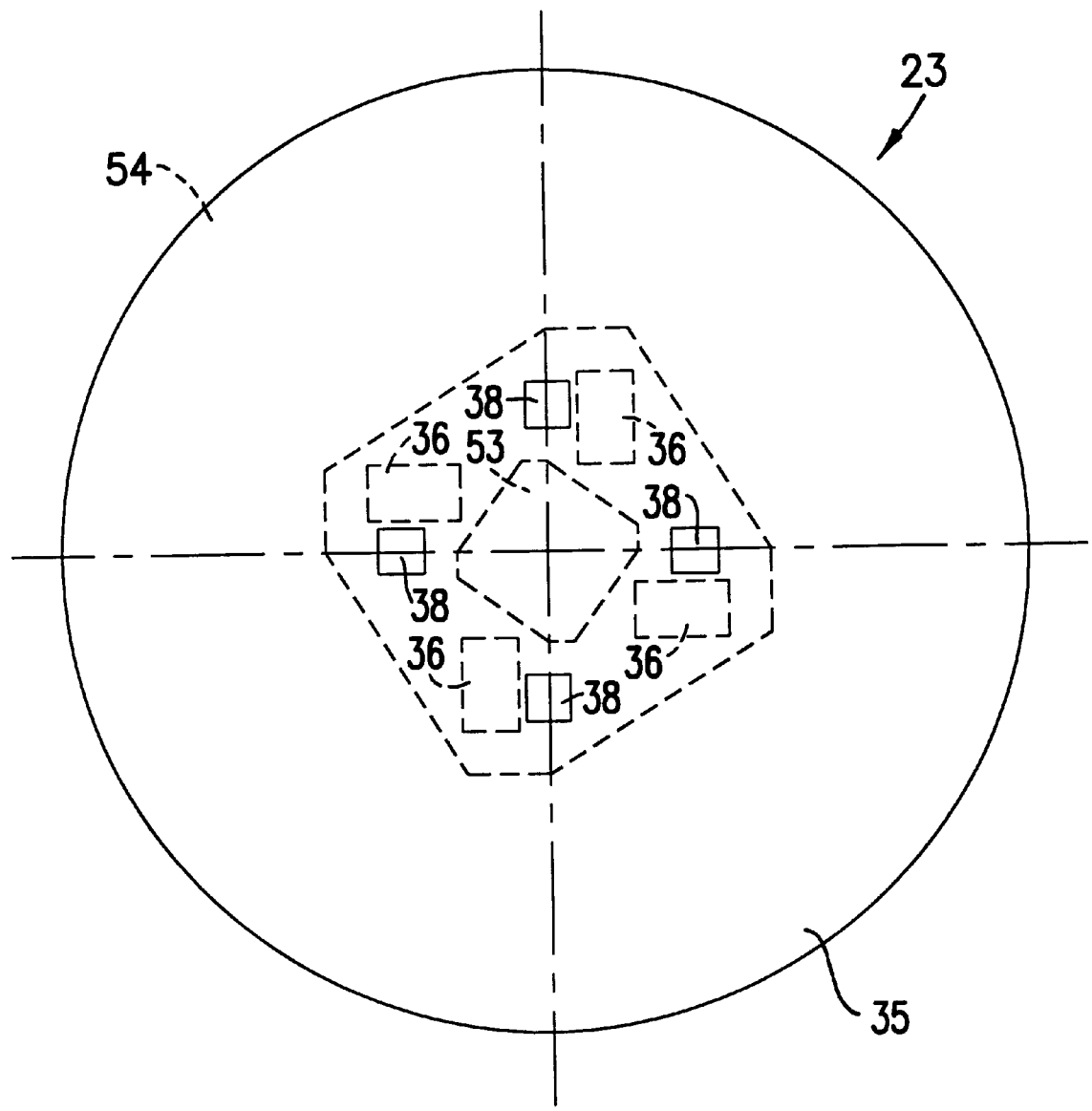
FIG. 13 shows a bottom view of the orifice plate according to yet another embodiment of the present invention.
Figure 14:
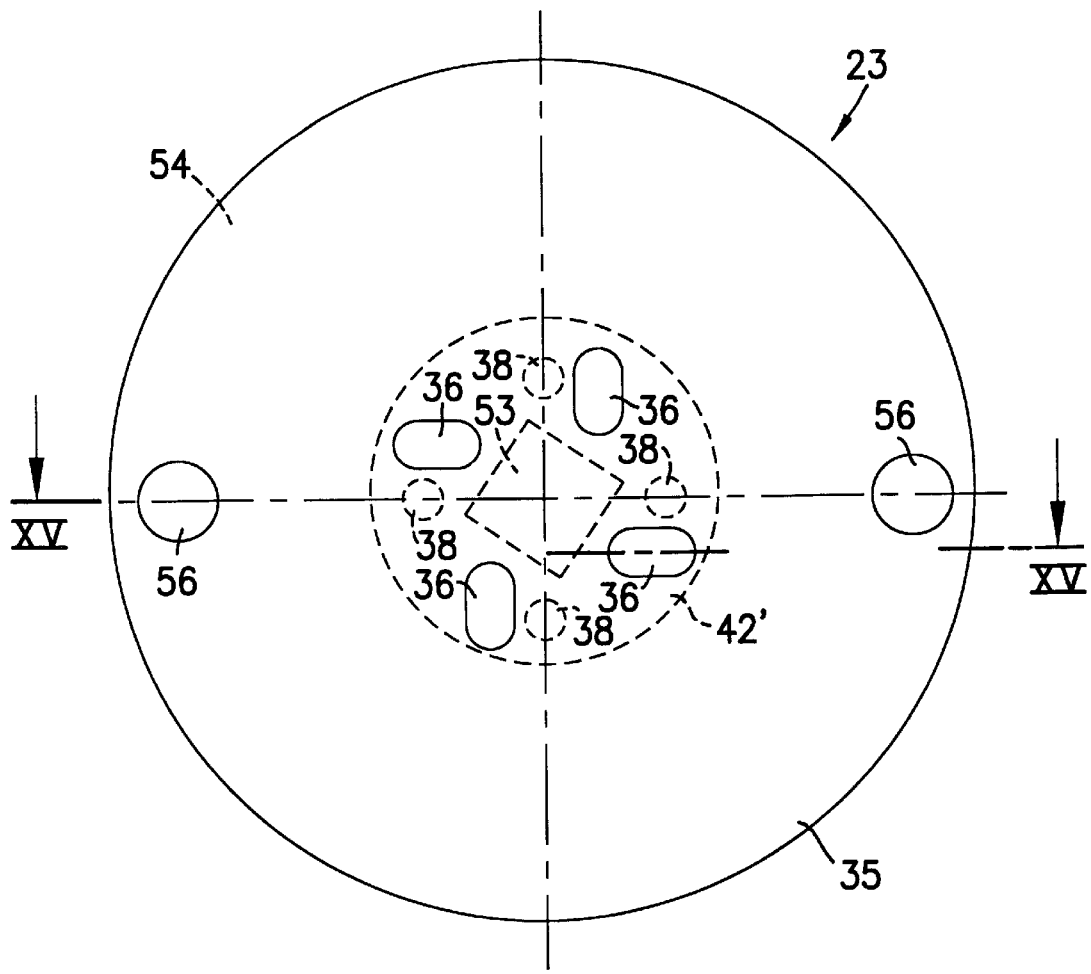
FIG. 14 shows a further orifice plate in a plan view with non-angular openings.

In the foregoing examples each inlet/outlet opening pair 36, 38 possessed a separate conduit 42 connecting these openings 36, 38. Depicted in FIGS. 11 and 12, in contrast thereto, is an exemplary embodiment that has only a single continuous conduit 42' in orifice plate 23. All four inlet openings 36 open into this, for example, square-shaped conduit 42', and all four outlet openings 38 also lead back out of conduit 42'. When rectangular or square outlet openings 38 are used, the outer contour of conduit 42' can be configured in the middle layer as an octagon, but almost as a square because each two corners are so close, as shown in FIG. 11. Conduit 42' is delimited toward the inside by a, for example, square material island 53 in middle layer 40. This inner material island 53 is approximately the same size in cross section as the region resulting in top layer 35 between inlet openings 36. Layer 40 thus consists of two sections, namely material island 53 completely surrounded by conduit 42', and an outer region 54 that in turn completely surrounds conduit 42'. FIG. 12 is a view of orifice plate 23 corresponding to a section along line XII—XII in FIG. 11.

Because of the additional connecting volume that results, there are more "dead zones" that the main flow passes by. Oscillation excitation of the main flow according to the cavity principle occurs in the dead zones with conduit cavities 43, 43'. The effect on stream forming and atomization is accordingly identical to that of the foregoing examples with conduit cavities 43, 43'.

The offset of outlet openings 38 from inlet openings 36 need not by any means extend radially, as was the case in the foregoing examples, but can be provided in any desired directions. Two exemplified embodiments of this kind of different offset are shown in FIGS. 13 and 14, which are views from below and above of orifice plate 23. It is clear from these that outlet openings 38 are instead offset in the circumferential direction from inlet openings 36, i.e. for example rotated 90° as compared to the examples with radial offset. Conduit 42' in middle layer 40 of orifice plate 23 in FIG. 13 has, for example an outer contour that is octagonal but almost square, the corners of the wall of conduit 42' always lying close to inlet and outlet openings 36 and 38. Material island 53 of middle layer 40 delimits conduit 42' toward the inside with a contour that is also almost square but has eight corners. The outer and inner delimiting walls of conduit 42' are configured, for example, rotated 45 degrees with respect to one another. Outer region 54 and material island 53 therefore have no walls running parallel to one another.

Orifice plate 23 shown in FIGS. 14 and 15 (section along line XV—XV in FIG. 14) is distinguished in particular by its non-angular inlet and outlet openings 36 and 38. Inlet openings 36 in top layer 35 possess, for example, an elliptical cross section, while outlet openings 38 in bottom layer 37 are circular in configuration. The inner material island 53 has, for example, a square cross section, while conduit 42' in middle layer 40 is delimited toward the outside in circular fashion by outer region 54. For better handling of orifice plates 23 during application of the various manufacturing methods, two positioning receptacles 56 are, for example, provided in the form of through holes near the outer boundary.

Inlet openings 36 and outlet openings 38 can be arranged with an offset of any magnitude to one another. In the exemplified embodiments in FIGS. 13 and 14, for example, much smaller offsets are present than in other embodiments previously shown. The stream direction and degree of turbulence can be tuned or adjusted by way of the magnitude of the offset.

Inlet openings 36, outlet openings 38, and conduits 42, 42' shown up to FIG. 13 have square or rectangular cross sections. The methods according to the invention also make it possible, however, to generate completely different cross sections for the flow-through geometries of orifice plate 23 (see FIG. 14). Modifications to cross sections consisting of rounded rectangles or squares, circles, circle segments, ellipses, ellipse segments, polygons, rounded polygons, etc. are possible. The walls of these individual structures extend largely parallel to longitudinal valve axis 2. Differences in the configuration of inlet openings 36 and outlet openings 38, which are joined directly to one another via a conduit 42, 42', can also be of interest. Transitions from square to rectangle and vice versa, from rectangle to circle and vice versa, or from ellipse to circle and vice versa, represent, for example, suitable cross-sectional changes.

A manufacturing method according to the invention that is particularly suitable and preferred for manufacturing orifice plate 23 will be elucidated further with reference to FIGS. 16 to 21. These Figures do not show exactly the exemplified embodiments of orifice plate 23 depicted in FIGS. 1 to 15 with the corresponding desired contours, but only arrangements elucidating the manufacturing principle. Specifically, the relative dimensions of the layer thicknesses as compared to the sizes of the openings or conduits differ particularly, in the examples shown in FIGS. 16 to 20, from the exemplified embodiments previously described. The manufacturing process steps according to the present invention nevertheless allow the manufacture, at any time, of the embodiments that are shown.

Because of stringent requirements in terms of structure dimensions and the precision of injection nozzles, microstructuring processes are today becoming increasingly important for industrial-scale manufacturing of them. In general what is required for the flow of the fluid, e.g. the fuel, inside the nozzle or orifice plate is a passageway which promotes the aforementioned formation of turbulence within the flow. In addition, the widths of the outlet openings should be on the order of a few tens of microns in order to achieve the most effective possible atomization of the fluid, e.g. the fuel. The present invention proposes a method for manufacturing metal orifice plates that is based on the successive application of photolithographic steps (UV three-dimensional lithography) followed by micro-electroplating. It is characteristic of the method that it guarantees highly accurate structures even on a large-area scale, so that it is ideal for mass production at very large unit volumes. A plurality of orifice plates 23 can be produced simultaneously on a single wafer by means of the process steps according to the present invention.

The starting point for the method is a flat, stable substrate plate 60 that can be made, for example, of metal (copper), silicon, glass, or ceramic. The usual thicknesses of this substrate plate 60 are between 500 microns and 2 mm; they do not, however, have any influence on the process steps which follow. Following cleaning of substrate plate 60, when an electrically nonconductive material such as glass or ceramic is used at least one auxiliary layer 61 is electroplated onto substrate plate 60. This is, for example, an electroplating initiator layer 61' (e.g. Cu), that is required for electrical conductivity for later micro-electroplating. Electroplating initiator layer 61' can also serve as a sacrificial layer 61, so as later to allow easy separation of the orifice plate structures by etching. If substrate plate 60 is already made of a conductive material, for example copper, electroplating initiator layer 61' can be omitted. If copper is used as the sacrificial/electroplating initiator layer 61, 61', a thin (e.g. 80 nm) chromium layer must be applied as an adhesion layer 61" between substrate plate 60 and electroplating initiator layer 61'. Auxiliary layer 61, 61', 61" (i.e. typically CrCu, or CrCuCr when a polyimide is used as photoresist) is applied, for example, by sputtering or by electroless metal deposition.

After this pretreatment of substrate plate 60, a photoresist 63 is applied onto the entire surface of the optional auxiliary layer 61, 61', 61". There are three particularly useful variants for doing this:

1. Laminating a solid resist at, for example, about 100 degrees C.;
2. Spin-coating a liquid resist; or
3. Spin-coating a polyimide in the liquid state.

With all three variants, photoresist 63 is present in solid form after drying. The thickness of photoresist 63 should correspond to the thickness of the metal layer that will be produced in the electroplating process that follows later, i.e. the thickness of bottom layer 37 of orifice plate 23. Layer thicknesses of between 10 and 300 microns are typically desirable, depending on the desired thickness of the layers of orifice plate 23. The metal structure to be implemented is then transferred inversely, by means of a photolithographic mask 64, into photoresist 63. One possibility is to expose photoresist 63 directly via mask 64 using UV illumination 65. Another possibility for structuring photoresist 63 provides for depositing onto photoresist 63 an oxide (for example $SiO_2$) or a nitride that, when photolithographically structured, serves as the mask for a dry etching process on photoresist 63. Another possibility is laser ablation, in which after application of a mask, material is removed explosively from photoresist 63 by means of a laser. These aforementioned process steps are summarized in graphic form in FIG. 16.

Figure 17:
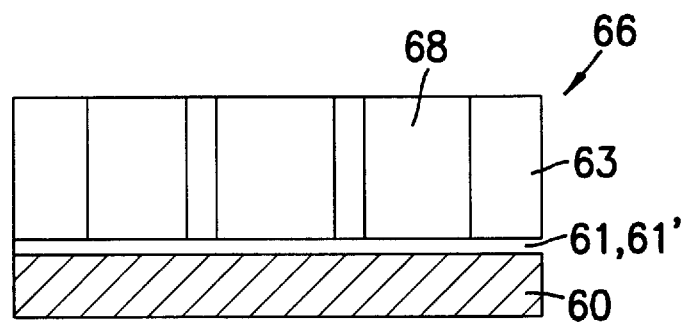
Figure 18:
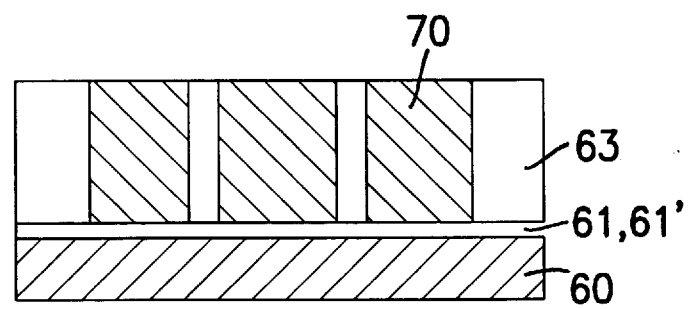

After development of the UV-exposed photoresist 63 or application of the other processes mentioned (dry etching, ablation), the result is a structure in photoresist 63 defined by mask 64, as shown by FIG. 17. This structure in photoresist 63 represents a negative structure 66 of the later layer 37 of orifice plate 23. FIG. 18 shows the structure after resist pits 68 formed in photoresist 63 have been filled up by electroplating at least up to the top edge of photoresist 63. Thus in the electroplating process step, metal 70 is deposited onto substrate plate 60 into resist pits 68. The electroplating causes metal 70 to conform tightly to the contour of negative structure 66, so that the predefined contours are faithfully reproduced in it. In order to manufacture multilayer orifice plate structures, the height of the electroplated layer of metal 70 should correspond to the height of photoresist 63. Depending on the desired design, photoresist structure 63 can also be higher than the desired electroplated layer. The thickness distribution of the electroplated layers can in fact be improved thereby. Selection of the material to be deposited depends on the particular requirements for the layer, particular weight being given to factors such as mechanical strength, chemical resistance, weldability, and others. Usually Ni, NiCo, NiFe, or Cu are used, but other metals and alloys are also possible.

Figure 19:
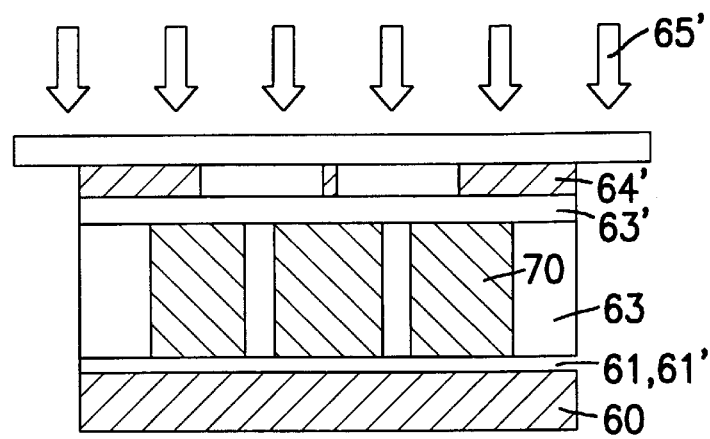

In order to implement the structure of orifice plate 23, the steps after the optional application of auxiliary layer 61, 61', 61" must be repeated in accordance with the number of layers desired. This is indicated in FIG. 19, the layer of photoresist 63' serving, for example, to form the later middle layer 40 of orifice plate 23. Reference symbols with an apostrophe (') refer to a repeated process. The individual metal layers are deposited in succession, and held together by metallic adhesion. Different metals 70 can also be used for the layers of a single orifice plate 23.

Figure 20:
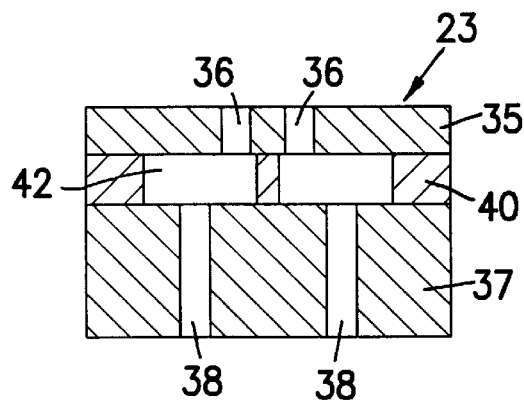

Lastly, orifice plates 23 are separated. This involves etching away sacrificial layer 60, causing orifice plates 23 to detach from substrate plate 60. Electroplating initiator layers 61' are then removed by etching, and the remaining photoresist 63, 63' is dissolved out of the metal structures. This can be done, for example, by a KOH treatment or an oxygen plasma, or by means of solvents (e.g. acetone) in the case of polyimides. These processes of dissolving out photoresist 63, 63' are referred to in general as "stripping." As an alternative solution, mechanical detachment of substrate plate 60, for example by means of magnets, is also possible if a suitable electroplating initiator layer 61' is selected. FIG. 20 shows by way of example a three-layer orifice plate 23 detached from substrate plate 60; the height of inlet openings 36 and outlet openings 38 will usually be less.

Figure 21:
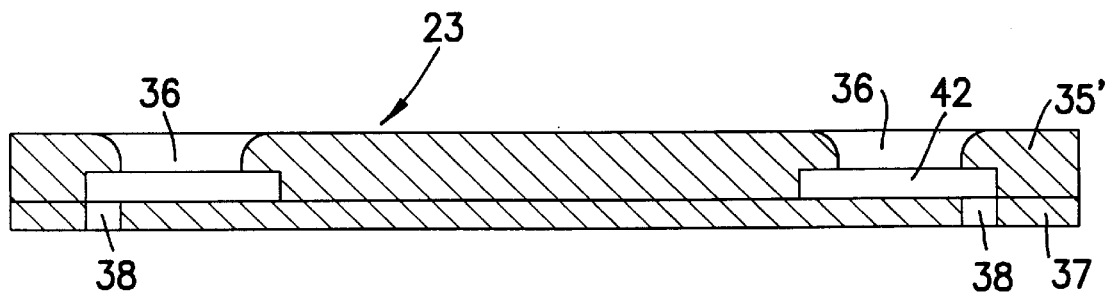
FIG. 21 shows the orifice plate after lateral overgrowth.

FIG. 21 depicts a further exemplified embodiment of an "S-type" orifice plate 23 manufactured by a technology which differs from the manufacturing method just described. This new technology can be referred to by the term "lateral overgrowth." The "lateral overgrowth" method makes it possible for two mutually contacting planes of orifice plate 23, referred to and depicted as "layers" in the discussion so far, to be configured in one step by electroplating deposition with no need for a third electroplating in the case of, for example, a three-layer orifice plate. The two planes thus constituted by "lateral overgrowth" are thus in this sense no longer "layers" built up separately from one another, but represent only one layer in the sense of one single growth without intervening delimitation.

Figure 16:
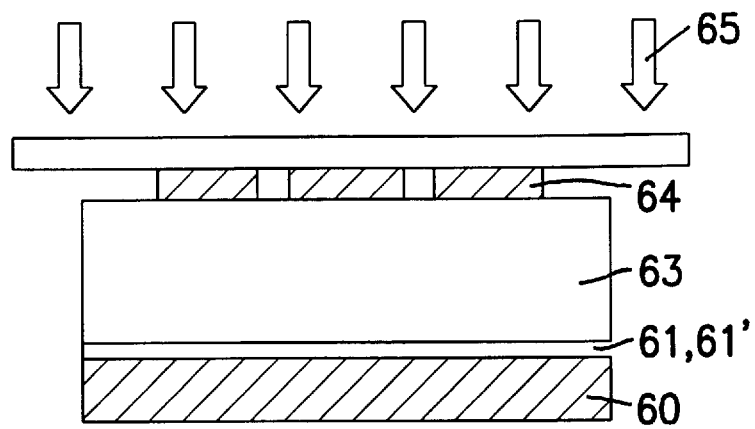
FIGS. 16 to 20 show process steps for manufacturing the orifice by multilayer electroplating.

Manufacture of bottom layer 37 occurs first in the known manner, as is evident from FIGS. 16 to 18. Metal 70 being deposited by electroplating then grows in the known manner around photoresist structure 63' of the second layer, up to the upper edge of photoresist 63' (FIG. 19). Then, however, the electroplating grows out beyond photoresist 63'. Overgrowth beyond photoresist structure 63' occurs in the horizontal and vertical directions on approximately the same order of magnitude. This overgrowth replaces the application of a further electroplating initiator layer 61' and the entire third electroplating layer, since two layers 35, 40 of the later orifice plate 23 are produced in one electroplating step. The height of the overgrowth is adjusted so that inlet openings 36 that are formed in the top growing layer 35' meet the requirements for S-type plates, i.e. are at an offset from outlet openings 38. Overgrowth is not interrupted at least until outlet openings 38 are completely overlapped by the material of overgrowing layer 35'. Two layers of photoresist 63, 63', which define the magnitude of outlet openings 38 and conduits 42, are therefore grown with this procedure. It is also possible to define the magnitude of inlet openings 26 by means of photoresist 63' as a further structured resist layer. For this, photoresist structure 63, 63' is then present in three planes. This third layer of photoresist 63' serves ultimately as a "stop" for the lateral overgrowth of layer 35' for defined configuration of inlet openings 36.

Round, oval, or polygonal inlet openings 36 can be achieved in this manner. With "lateral overgrowth," there is in particular a definite reduction in the time needed to manufacture orifice plate 23. In addition, the roughness of the electroplated surface is decreased, since the roughness of the electroplated surface increases with the number of layers being applied. Additional smoothing actions, for example by means of electropolishing, are thus not absolutely necessary. A further advantage of lateral overgrowth consists in the fact that a new electroplating initiator layer 61' does not need to be applied onto the electrically nonconductive photoresist 63' in order to shape inlet openings 36.

FIGS. 22 to 33 depict further exemplified embodiments of orifice plates 23, which will be explained only briefly, since they all have the fundamental features of S-type plates and simply demonstrate interesting designs or configurations. All these embodiments of orifice plates according to the present invention can be built up with the electroplating metal deposition manufacturing method that has been described in detail above.

Figure 22:
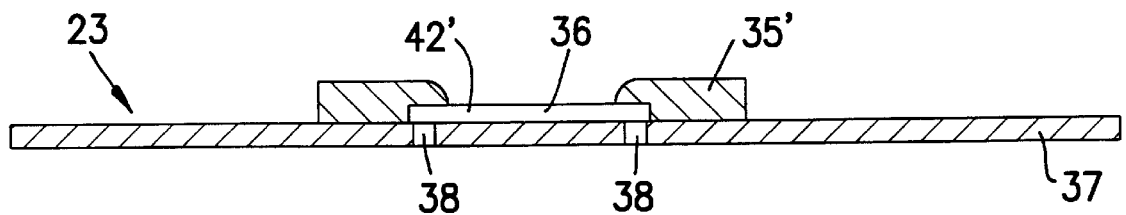
FIG. 22 shows a sectioned illustration of the orifice plate with different diameters for the individual layers.
Figure 23:
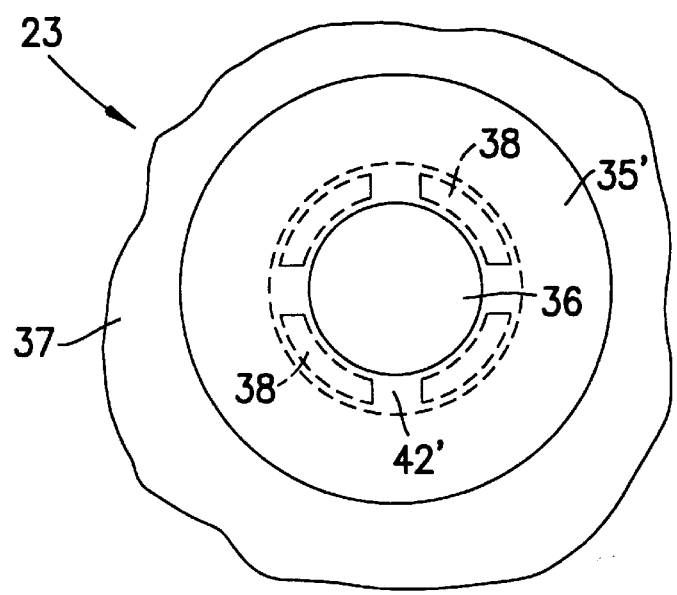
FIG. 23 shows a plan view of the central region of the orifice plate depicted in section as illustrated in FIG. 22.

FIGS. 22 and 23 show an orifice plate 23 that once again is manufactured at least partly by lateral overgrowth. Top layer 35' has at least two functional planes, i.e. one plane in which conduit 42' extends, and a plane above it which has inlet opening 36. Bottom layer 37 possesses, for example, a substantially greater diameter than top layer 35'. While inlet opening 36 has a circular cross section, the four outlet openings 38 are arranged as sickle shapes in a circular arc form. Conduit 42' located in the bottom plane of top layer 35' is also, like inlet opening 36, circular in shape, with a diameter that is somewhat greater than the outside diameter of the sickle-shaped outlet openings 38. In this arrangement, the "S-bend" of the fluid occurs radially outward, resulting in a radially symmetrical stream pattern with good atomization.

Figure 24:
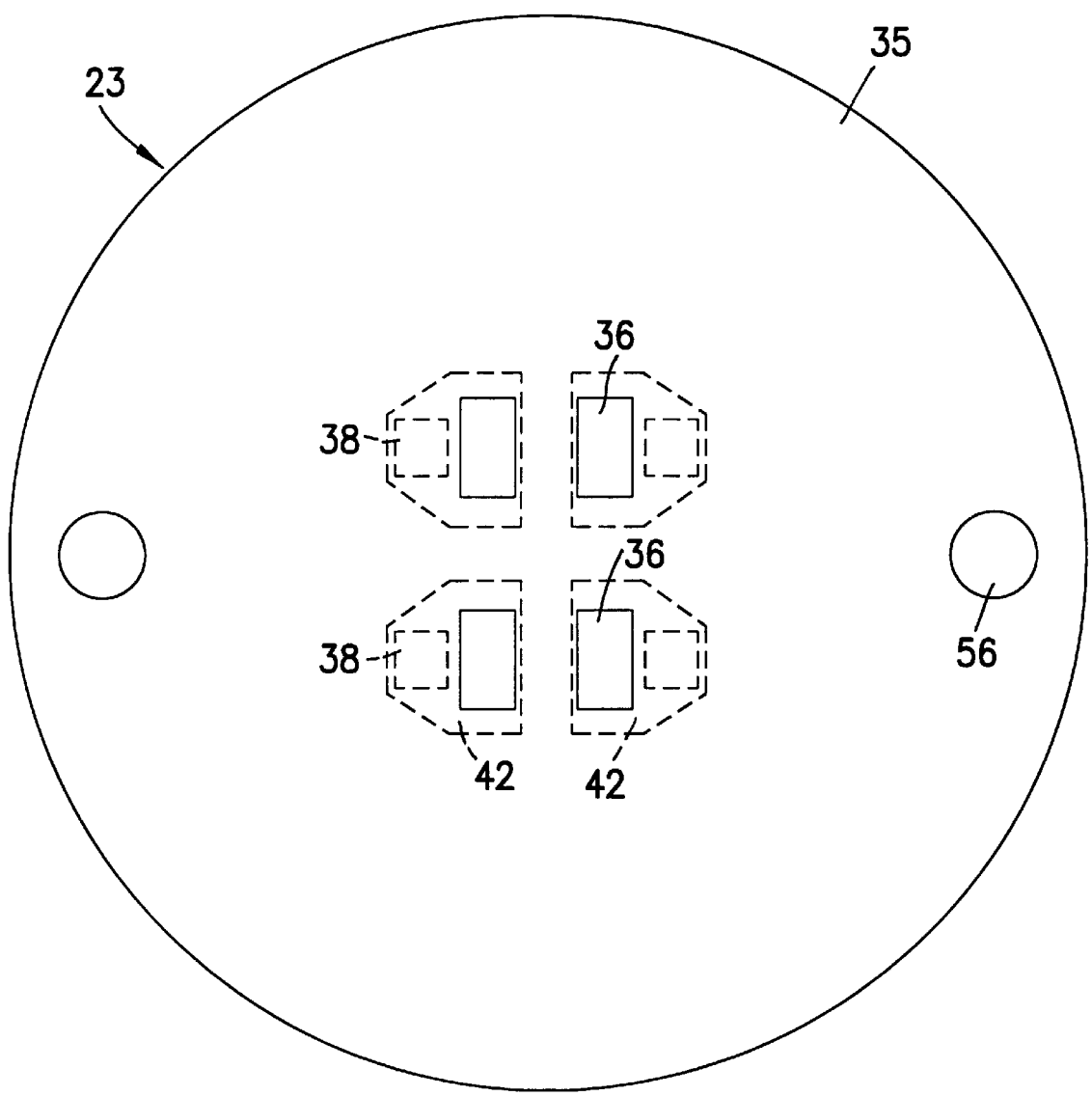
FIG. 24 shows a further orifice plate in a plan view.
Figure 25:
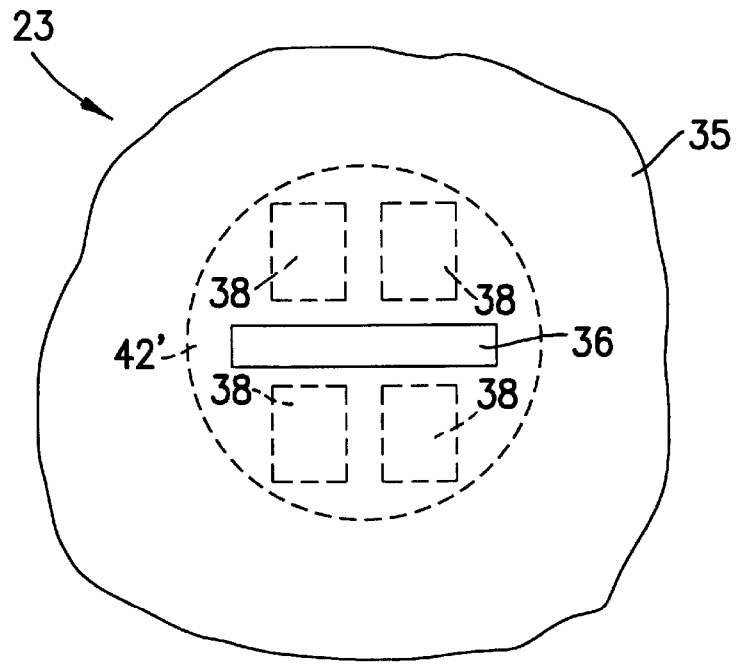
FIGS. 25 to 27 show three central regions of orifice plates, each with a rectangular inlet opening.
Figure 26:
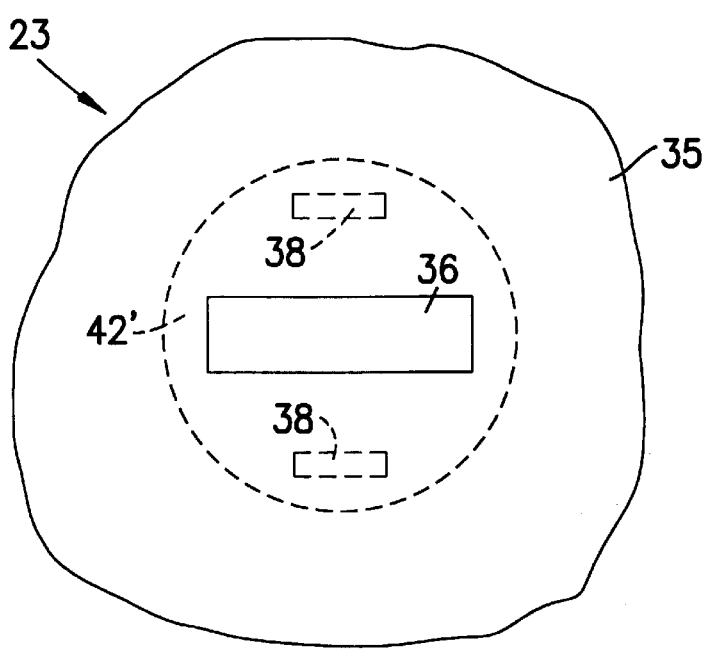
Figure 27:
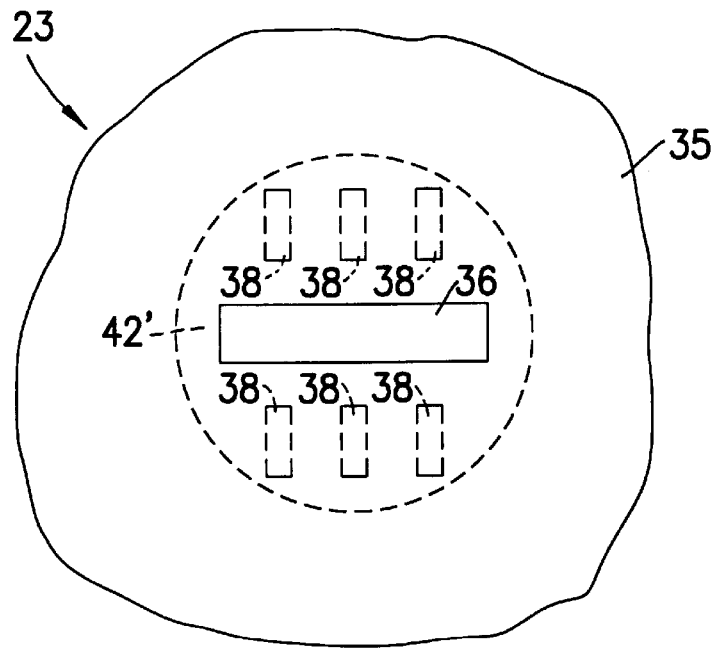

FIG. 24 shows a plan view of an orifice plate 23 which allows flat-stream spray discharge. The four inlet openings 36 in top layer 35 are rectangular in shape. Associated with each inlet opening 36 is exactly one conduit 42 and one outlet opening 38. Outlet openings 38 are, for example, square or rectangular in shape. Conduits 42, which completely overlap inlet and outlet openings 36 and 38 in projection, possess a hexagonal contour that can be modified to correspond to the size of inlet and outlet openings 36 and 38. The offsets of inlet and outlet openings 36 and 38 are selected so that good preparation with flat stream patterns occurs in two directions.

Like FIG. 24, FIGS. 25 to 27 show plan views of orifice plates 23 with which flat streams can be generated. As simplified drawings, these Figures show only the central middle region of orifice plate 23. Conduit 42' is configured in each case so that it joins one inlet opening 36 to all outlet openings 38. The fluid flows in through the central rectangular inlet opening 36. Outlet openings 38 are, for example, also configured with a rectangular or square contour; the longitudinal extension directions of rectangular outlet openings 38 can be parallel or perpendicular to the longitudinal extension direction of inlet opening 36. In any case a flat stream pattern once again results from this kind of offset. Stream shaping can be adapted to specific requirements by varying the size of inlet opening 36 and the arrangement, number, and shape of outlet openings 38.

Figure 31:
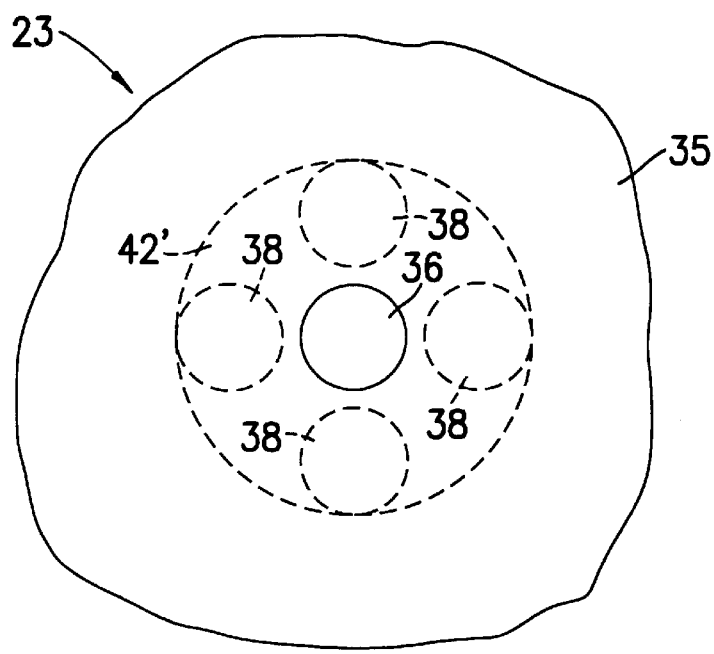
FIG. 31 shows a central region of the orifice plate with exclusively circular openings.
Figure 28:
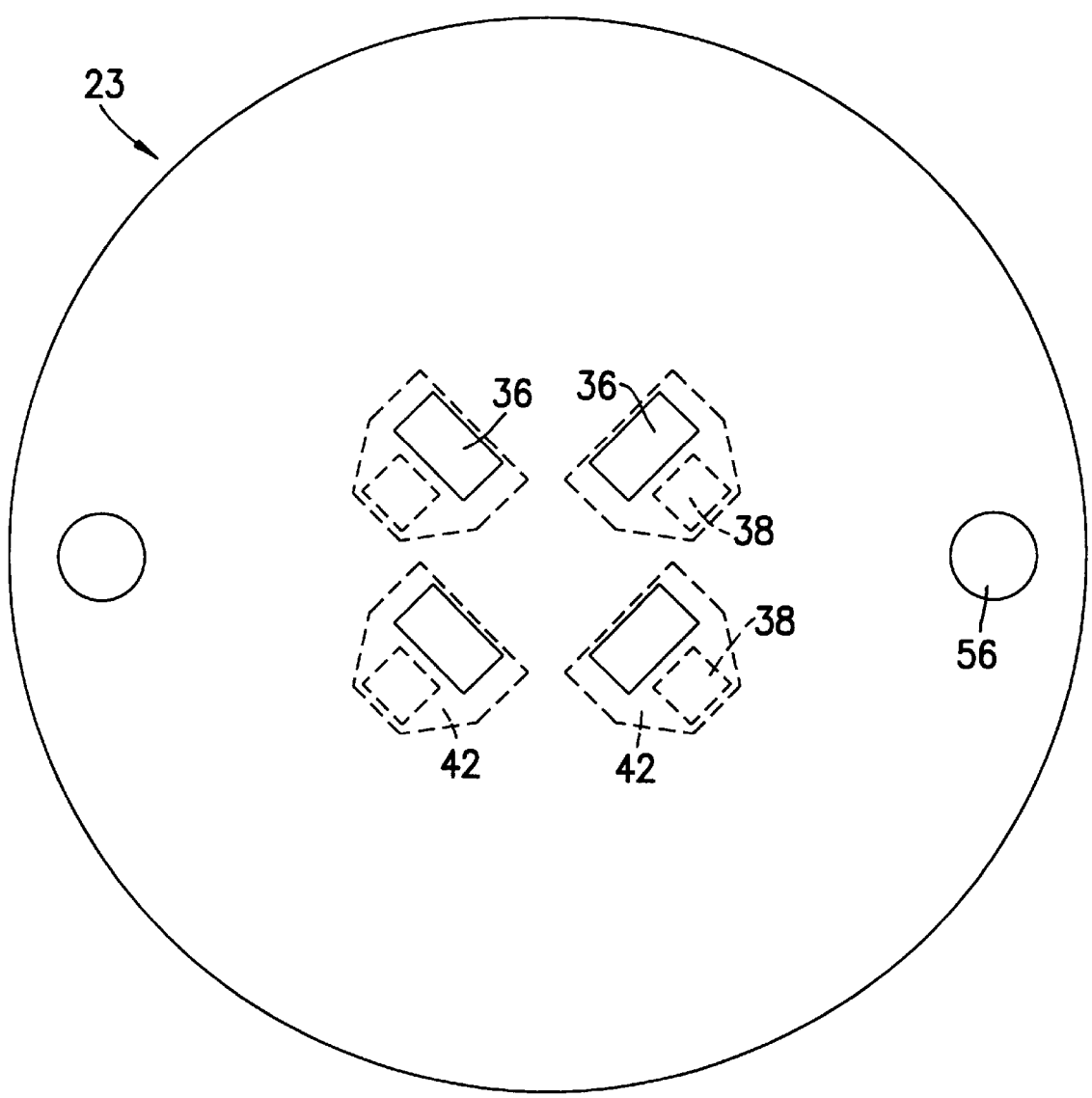
FIG. 28 shows an orifice plate in a plan view, with asymmetrical distribution of the opening regions.

FIG. 28 shows an orifice plate 23 that is very similar, in terms of geometry and the size of the individual opening regions, to orifice plate 23 depicted in FIG. 24. For particular application purposes, for example when injection valves are installed on internal combustion engines in unusual locations, it is desirable not only to have a flat stream emerging from orifice plate 23, but also for spray discharge to occur at a specific angle to longitudinal valve axis/center axis 2 (FIGS. 1 and 31). This is possible with orifice plate 23 according to FIG. 28. A respective functional unit consisting of inlet opening 36, conduit 42, and outlet opening 38 once again makes possible a spray cone in the direction of the S-bend. Four such functional units are provided in this exemplified embodiment. If these spray or stream cones are combined in a suitable manner, the overall stream pattern can be adapted very easily to the particular conditions. With orifice plate 23 depicted in FIG. 28, spray discharge can occur controllably in two directions; the two individual streams are not oriented exactly oppositely.

Figure 29:
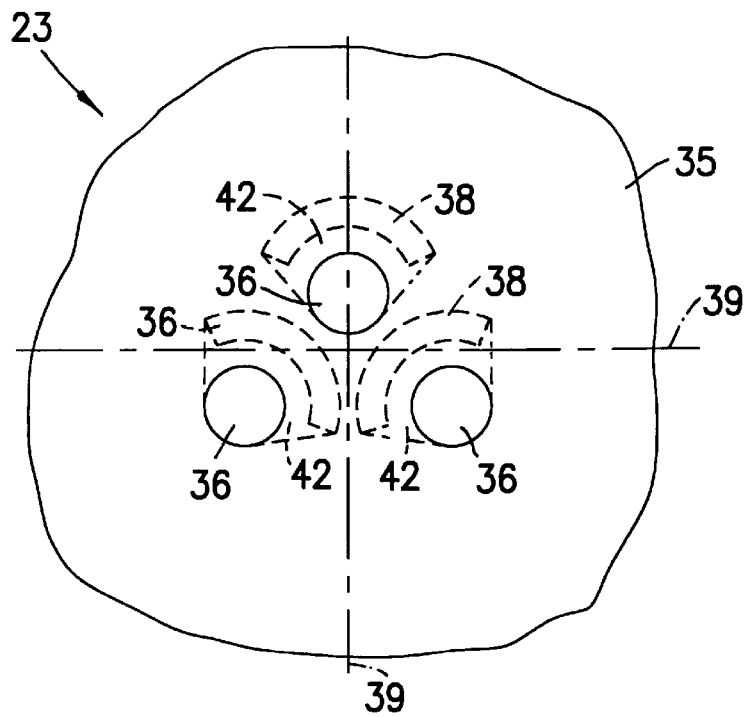
FIGS. 29 and 30 show two central regions of orifice plates with asymmetrical distribution of the opening regions.
Figure 30:
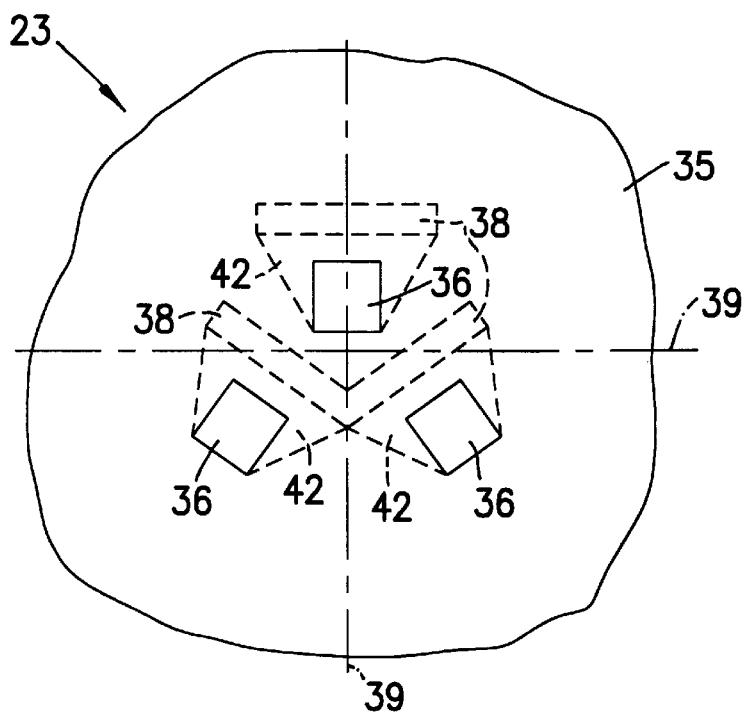

FIGS. 29 and 30 depict central spray discharge regions of orifice plates 23 with which unusual stream patterns can also be produced. Orifice plates 23 each possess three functional units with an inlet opening 36, a conduit 42, and an outlet opening 38. Depending on the desired stream pattern, the functional units are arranged asymmetrically or eccentrically about center axis 2 of orifice plate 23 which runs through the intersection point of the two axes 39. Individual stream directions can be very easily achieved with this apparently disordered distribution. In the orifice plate according to FIG. 29, a conduit 42 with a contour shaped like a circular sector connects each sickle-shaped inlet opening 36 to a sickle-shaped outlet opening 38. The opening regions in orifice plate in FIG. 30 are, in contrast, angular in shape. The fluid enters through, for example, square inlet openings 36, then flows through hexagonal conduits 42 to outlet openings 38, which are rectangular in shape. Conduits 42 associated with two inlet openings 36 can, for example, extend in such a way that they merge in the region of outlet openings 38, the fluid then also emerging from orifice plate 23 only through a V-shaped outlet opening 38. Thus the number of inlet and outlet openings 36 and 38 does not by any means need to be identical.

Figure 32:
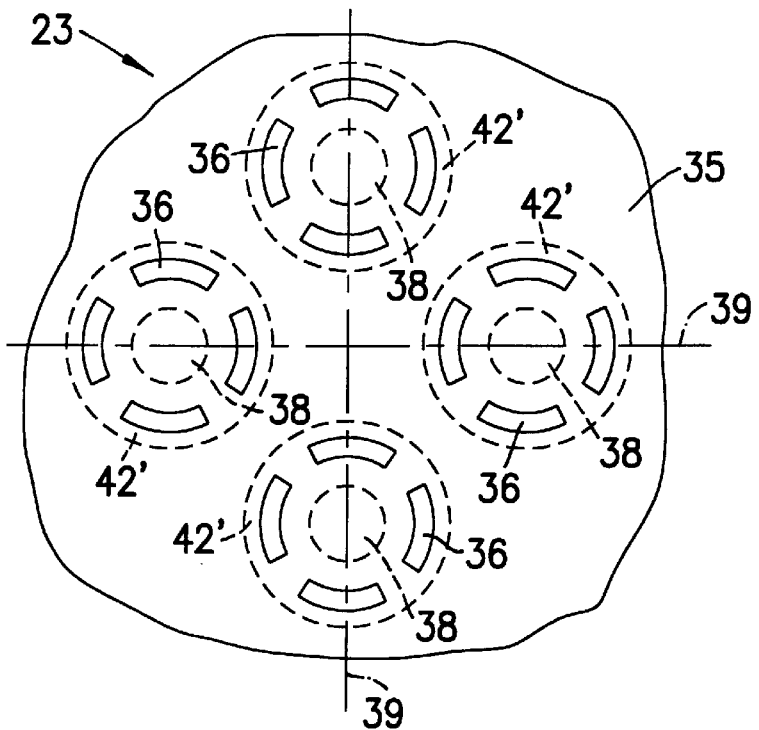
FIG. 32 shows a central region of the orifice plate with sixteen sickle-shaped inlet openings.
Figure 33:
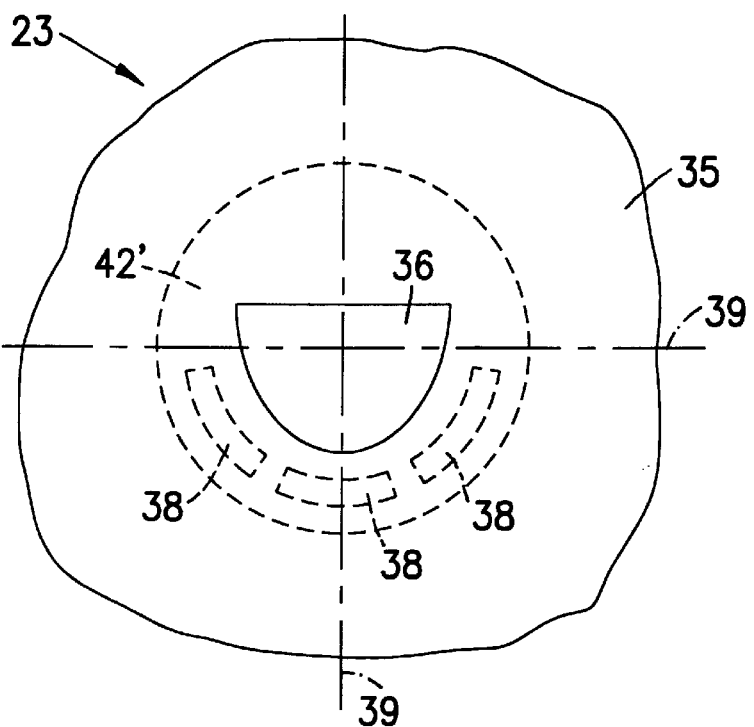
FIG. 33 shows a central region of the orifice plate with an approximately semicircular inlet opening and sickle-shaped outlet openings.

Orifice plates 23 in which inlet and outlet openings 36 and 38 are not provided in equal numbers are also shown in FIGS. 31 to 33. The exemplified embodiment in FIG. 31 elucidates an arrangement with exclusively circular opening regions. The fluid can enter through a central circular inlet opening 36 of top layer 35, and leave orifice plate 23 through four also circular outlet openings 38 that are configured in bottom layer 37 symmetrically around inlet opening 36. The one circular conduit 42' is made so large that all outlet openings 38 are completely overlapped by it.

FIG. 32 depicts an orifice plate 23 that has four functional units with opening regions. A fluid enters orifice plate 23 through four sickle-shaped inlet openings 36 belonging to each functional unit, and thus in total through sixteen such openings. Associated with each four inlet openings 36 is exactly one circular conduit 42', which for example has a diameter sufficiently large that it completely overlaps the sickle-shaped inlet openings 36. Only one outlet opening 38, which is circular in shape and in projection is surrounded by the sickle-shaped inlet openings 36, is shaped in each functional unit. The four functional units are, for example, arranged symmetrically with respect to center axis 2, lying on axes 39.

FIG. 33 shows an orifice plate 23 that has a completely asymmetrical arrangement of the opening regions. The centrally arranged inlet opening 36 is shaped with an approximately semicircular contour, while the much smaller outlet openings 38 extend in bottom layer 37 as sickle shapes on the rounded side of inlet opening 36. The number of outlet openings 38 can be varied as desired; in the example depicted, three outlet openings 38 are provided. The circular conduit 42' is once again made sufficiently large that all the other openings are overlapped by it.

All the orifice plates 23 described are not provided exclusively for use on injection valves; they can instead also be used, for example, in paint nozzles, inhalers, or inkjet printers, or in freeze-drying processes. Orifice plates 23 are quite generally suitable for producing fine spray, for example with large angles. In addition to the method, described in detail, for manufacturing orifice plates by micro-electroplating, other methods such as die-sink electrodischarge machining, wire-cut electrodischarge machining, punching, vacuum metal evaporation, sintering, or plastic injection molding are conceivable for the manufacture of the S-type plates having the contour described above.

Figure 15:
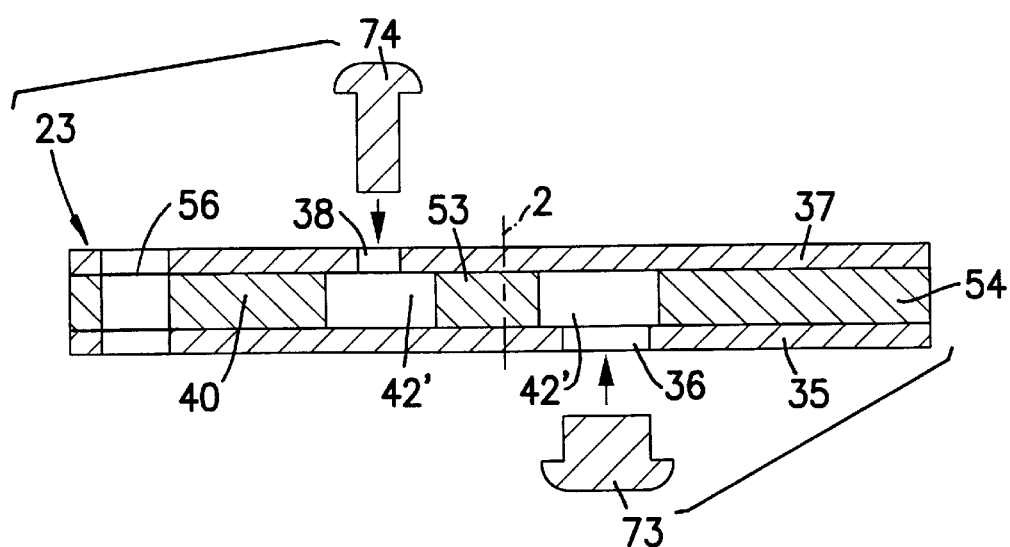
FIG. 15 shows an orifice plate in section along line XV—XV as illustrated in FIG. 14, with schematic tools (in reverse flow direction).

FIG. 15 therefore schematically depicts several tools intended to illustrate these production methods. Positioning receptacles 56 make possible exact mutual positioning when the individual metal plates are fitted together. The individual layers of orifice plate 23 are nevertheless machined separately from one another prior to fitting, for example with punches 73 in the case of punching, or with tool electrodes 74 in the case of electrodischarge machining. In addition to use of a metallic material for the orifice plates according to the invention, a ceramic material could also be used for S-type plates.

We claim:

1. An orifice plate, comprising:
   a top layer including at least one inlet opening;
   a bottom layer including at least one outlet opening; and
   at least one middle layer positioned between the top layer and the bottom layer, the at least one middle layer having at least one conduit completely connecting the at least one inlet opening to the at least one outlet opening for forming at least one complete through passage for a fluid;
   wherein the at least one inlet opening is positionally offset from the at least one outlet opening for preventing an overlap when the at least one inlet opening is projected into a plane;
   and further comprising at least one interrupter positioned within the at least one middle layer to form an eddy train when the flow passes by the at least one interrupter in the at least one conduit.

2. The orifice plate according to claim 1, wherein the orifice plate is composed of at least one metallic material.

3. The orifice plate according to claim 1, wherein the at least one conduit corresponds to the at least one inlet opening and the at least one outlet opening.

4. The orifice plate according to claim 1, wherein the at least one inlet opening is connected with the at least one outlet opening.

5. The orifice plate according to claim 1, wherein the at least one inlet opening is positioned closer to a center axis of the orifice plate than the at least one outlet opening for generating a radial offset.

6. The orifice plate according to claim 1, wherein the at least one inlet opening includes a first opening width, and wherein the at least one outlet opening includes a second opening width, the first opening width being different from the second opening width.

7. The orifice plate according to claim 1, wherein the at least one inlet opening and the at least one outlet opening are positioned completely symmetrically about a center axis of the orifice plate.

8. The orifice plate according to claim 1, wherein the at least one conduit has a conduit size adapted for completely overlapping the at least one inlet opening and the at least one outlet opening when in a projection.

9. The orifice plate according to claim 1, wherein the at least one conduit includes at least one conduit cavity positioned away from the complete through passage.

10. The orifice plate according to claim 9, wherein the at least one conduit cavity has a cavity height, the cavity height being substantially equal to a conduit height of the at least one conduit.

11. The orifice plate according to claim 9, wherein the at least one conduit cavity has a cavity height and cavity width, the cavity height being equal to the cavity width.

12. The orifice plate according to claim 1, further comprising a further middle layer including at least one conduit cavity positioned away from the complete through passage.

13. The orifice plate according to claim 1, further comprising:
    a first further middle layer; and
    a second further middle layer, the at least one conduit extending in at least one of the middle layer, the first further middle layer and the second further middle layer,
    wherein the first and second further middle layers include conduit cavities positioned away from the complete through passage.

14. The orifice plate according to claim 9, wherein the at least one conduit cavity is shaped for positioning relative to the at least one conduit.

15. The orifice plate according to claim 1, wherein the at least one inlet opening includes an inlet cross-section contour corresponding to an outlet cross-section contour of the at least one outlet opening.

16. The orifice plate according to claim 1, wherein the at least one inlet opening includes an inlet cross-section contour differing from an outlet cross-section contour of the at least one outlet opening.

17. The orifice plate according to claim 1, wherein the at least one inlet opening includes an inlet cross-section contour, and wherein the at least one outlet opening includes an outlet cross-section contour, the inlet cross-section contour and the outlet cross-section contour being at least one of squares, rectangles, rounded squares, rounded rectangles, circles, circle segments, ellipses, ellipse segments, polygons and rounded polygons.

18. The orifice plate according to claim 1, wherein the at least one inlet opening has an inlet amount, and wherein the at least one outlet opening has an outlet amount, the inlet amount being different from the outlet amount.

19. The orifice plate according to claim 1, wherein the orifice plate is manufactured using an electroplating metal deposition.

20. The orifice plate according to claim 1, wherein the at least one inlet opening, the at least one outlet opening and the at least one conduit are manufactured using an electrodischarge machining process.

21. The orifice plate according to claim 1, wherein the at least one inlet opening, the at least one outlet opening and the at least one conduit are manufactured using a punching process.

22. The orifice plate according to claim 1, wherein the orifice plate is manufactured using a plastic injection molding.

23. The orifice plate according to claim 1, wherein the orifice plate is manufactured from a ceramic material.

24. An orifice plate, comprising:
    a top layer including at least two inlet openings;
    a bottom layer including at least two outlet openings;
    wherein a number of the inlet openings is equal to a number of the outlet openings;
    wherein all of the inlet openings are positionally offset from all of the outlet openings for preventing an overlap when all of the inlet openings are projected into a plane;

at least one middle layer positioned between the top layer and the bottom layer, the at least one middle layer having exactly one conduit completely connecting all of the inlet openings to all of the outlet openings for forming one complete through passage for a fluid.

25. The orifice plate according to claim 24, wherein the top layer includes four inlet openings and the bottom layer includes four outlet openings.

26. An orifice plate, comprising:

a top layer including at least one inlet opening;

a bottom layer including at least one outlet opening; and at least one middle layer positioned between the top layer and the bottom layer, the at least one middle layer having at least one conduit completely connecting the at least one inlet opening to the at least one outlet opening for forming at least one complete through passage for a fluid, wherein the at least one inlet opening is positionally offset from the at least one outlet opening for preventing an overlap when the at least one inlet opening is projected into a plane, wherein the top layer, the bottom layer and the at least one middle layer are composed of a plastic material.

27. An orifice plate, comprising:

a top layer including at least one inlet opening;

a bottom layer including at least one outlet opening; and at least one middle layer positioned between the top layer and the bottom layer, the at least one middle layer having at least one conduit completely connecting the at least one inlet opening to the at least one outlet opening for forming at least one complete through passage for a fluid, wherein the at least one inlet opening is positionally offset from the at least one outlet opening for preventing an overlap when the at least one inlet opening is projected into a plane, wherein the top layer, the bottom layer and the at least one middle layer are composed of a ceramic material.

* * * * *